United States Patent
Sakai et al.

(10) Patent No.: US 9,625,805 B2
(45) Date of Patent: Apr. 18, 2017

(54) REFLECTIVE MASK BLANK, REFLECTIVE MASK AND METHOD OF MANUFACTURING REFLECTIVE MASK

(71) Applicant: HOYA CORPORATION, Shinjuku-ku, Tokyo (JP)

(72) Inventors: Kazuya Sakai, Shinjuku-ku (JP); Ryo Ohkubo, Shinjuku-ku (JP); Osamu Nozawa, Shinjuku-ku (JP); Toshiyuki Suzuki, Shinjuku-ku (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 69 days.

(21) Appl. No.: 14/729,164

(22) Filed: Jun. 3, 2015

(65) Prior Publication Data

US 2015/0261083 A1    Sep. 17, 2015

Related U.S. Application Data

(63) Continuation of application No. 13/628,790, filed on Sep. 27, 2012, now Pat. No. 9,075,315.

(30) Foreign Application Priority Data

Sep. 28, 2011 (JP) .................. 2011-212585

(51) Int. Cl.
 *G03F 1/24* (2012.01)
 *G03F 1/58* (2012.01)
 *G03F 1/80* (2012.01)

(52) U.S. Cl.
 CPC .............. *G03F 1/24* (2013.01); *G03F 1/58* (2013.01); *G03F 1/80* (2013.01)

(58) Field of Classification Search
 USPC ............................................... 430/5
 See application file for complete search history.

(56) References Cited

U.S. PATENT DOCUMENTS

| 8,329,361 B2 | 12/2012 | Hosoya |
| 8,524,421 B2 | 9/2013 | Nozawa et al. |
| 8,637,213 B2 | 1/2014 | Hashimoto |

(Continued)

FOREIGN PATENT DOCUMENTS

| JP | 2002-246299 A | 8/2002 |
| JP | 2006-078807 A | 3/2006 |

(Continued)

OTHER PUBLICATIONS

Communication dated Apr. 26, 2016, from the Japanese Patent Office in counterpart application No. 2012-172751.

(Continued)

*Primary Examiner* — Stephen Rosasco
(74) *Attorney, Agent, or Firm* — Sughrue Mion, PLLC

(57) ABSTRACT

The present invention is a reflective mask blank used to fabricate a reflective mask, which has a laminated structure of a multilayer reflective film, an absorber film and an etching mask film in this order on a substrate, wherein the etching mask film comprises a material containing chromium, the absorber film comprises a material containing tantalum, a highly oxidized layer is formed on the surface layer of the absorber film on the opposite side from the substrate, and a Ta 4f narrow spectrum of the highly oxidized layer when analyzed by X-ray photoelectron spectroscopy has a maximum peak at a binding energy of more than 23 eV.

22 Claims, 8 Drawing Sheets

(56) References Cited

U.S. PATENT DOCUMENTS

| | | |
|---|---|---|
| 8,709,685 B2 | 4/2014 | Hosoya |
| 8,962,220 B2 | 2/2015 | Matsuo |
| 8,986,910 B2 | 3/2015 | Mikami |
| 9,195,133 B2 | 11/2015 | Hashimoto |
| 2005/0208389 A1 | 9/2005 | Ishibashi et al. |
| 2008/0070127 A1 | 3/2008 | Wu |
| 2008/0248409 A1 | 10/2008 | Ishibashi et al. |
| 2010/0143831 A1 | 6/2010 | Yoshikawa et al. |
| 2010/0266938 A1 | 10/2010 | Hosoya |
| 2012/0021344 A1 | 1/2012 | Matsuo |
| 2012/0189946 A1 | 7/2012 | Hashimoto |
| 2012/0225375 A1 | 9/2012 | Mikami |
| 2013/0071779 A1 | 3/2013 | Hosoya |
| 2014/0087292 A1 | 3/2014 | Hashimoto |
| 2016/0041464 A1 | 2/2016 | Hashimoto |

FOREIGN PATENT DOCUMENTS

| | | |
|---|---|---|
| JP | 2008118143 A | 5/2008 |
| JP | 2010-192503 A | 9/2010 |
| JP | 2011129611 A | 6/2011 |
| TW | 201100950 A1 | 1/2011 |
| TW | 201100951 A1 | 1/2011 |
| TW | 201115263 A1 | 5/2011 |
| TW | 201131284 A1 | 9/2011 |

OTHER PUBLICATIONS

Notification of Reasons for Refusal issued in corresponding Taiwanese Patent Application No. 10521611170 dated Dec. 29, 2016.

REFLECTIVE MASK BLANK, REFLECTIVE MASK AND METHOD OF MANUFACTURING REFLECTIVE MASK

This is a Continuation of application Ser. No. 13/628,790, filed Sep. 27, 2012, claiming priority based on Japanese Patent Application No. 2011-212585 filed on Sep. 28, 2011, the contents of all of which are incorporated herein by reference in their entirety.

TECHNICAL FIELD

The present invention relates to a reflective mask blank, a reflective mask, and method of manufacturing a reflective mask.

BACKGROUND ART

Recently in the semiconductor industry, EUV lithography, which is an exposure technology that uses extreme ultraviolet (EUV) light, is considered to be promising accompanying the miniaturization of semiconductor devices. EUV light refers to light of a wavelength band of the soft X-ray region or vacuum ultraviolet region, and more specifically, refers to light having a wavelength of about 0.2 nm to 100 nm. Examples of transfer masks proposed for use in this EUV lithography include the reflective exposure mask described in Patent Literature 1 (JP-A-2002-246299) and the reflective photomask described in Patent Literature 2 (JP-A-2010-192503).

On the other hand, miniaturization of transfer patterns formed on light shielding layers has become remarkable in recent years even in the case of binary masks used in lithography using an ArF excimer laser for the exposure light source. The direct formation of a transfer pattern by using a resist pattern of an organic material as a mask and carrying out dry etching on a light shielding layer is becoming increasingly difficult. As means for solving this problem, etching mask films of metal-based materials (hard masks) as described in Patent Literature 3 (JP-A-2006-78807) have come to be applied.

BRIEF SUMMARY OF THE INVENTION

In the case of a transfer mask having a light shielding layer of a molybdenum silicide-based material (binary mask) as described in Patent Literature 3 (JP-A-2006-78807), the transfer mask is fabricated using a mask blank in which a light shielding layer composed of a molybdenum silicide-based material, an etching mask film composed of a chromium-based material, and a resist film composed of an organic material are laminated on a transparent substrate. The production process of this transfer mask comprises first forming a resist pattern by carrying out prescribed treatment such as exposure drawing and development using a transfer pattern on the resist film in the same manner as in the past. Next, dry etching is carried out on an etching mask film using a mixed gas of a chlorine-based gas and oxygen gas by using the resist pattern as a mask to form a transfer pattern on the etching mask film. Continuing, dry etching is carried on a light shielding layer using a fluorine-based gas by using the etching mask film in which the transfer pattern has been formed as a mask to form a transfer pattern on the light shielding layer. Finally, the etching mask film is removed and conventional prescribed treatment such as washing is carried out to obtain a transfer mask.

The reason why this type of production process is able to be carried out is that dry etching properties differ between the etching mask film of the chromium-based material and the light shielding layer of the molybdenum silicide-based material. Although etching mask films of chromium-based materials can be dry-etched with a mixed gas of a chlorine-based gas and oxygen gas, they are highly resistant to dry etching with a fluorine-based gas. In contrast, although light-shielding layers of molybdenum silicide-based materials can be dry-etched with a fluorine-based gas, they are highly resistant to dry etching with a mixed gas of a chlorine-based gas and oxygen gas. In this manner, etching mask films of chromium-based materials and light shielding layers of molybdenum silicide-based materials mutually have high etching selectivity. Furthermore, being able to dry-etch a thin film as referred to here refers to having an etching rate sufficient for allowing the formation of a transfer pattern on a thin film when dry etching is carried out on that thin film by using a mask layer having a transfer pattern as a mask.

On the other hand, there are many cases in which tantalum-based materials are applied to absorber films in the form of thin films on which a transfer pattern of a reflective mask is formed. In the case of producing this reflective mask, it was found that there were unique problems to tantalum-based materials in the case of examining the use of a reflective mask blank obtained by laminating a multilayer reflective film that reflects EUV light, an absorber film composed of a tantalum-based material, an etching mask film composed of a chromium-based material, and a resist film composed of an organic material on a substrate. In the case of dry etching a tantalum-based material that demonstrates little bonding with oxygen (oxygen content in the material is low), a fluorine-based gas, or a chlorine-based gas without containing oxygen can be used for the etching gas. In contrast, in the case of a tantalum-based material that demonstrates extensive bonding with oxygen (oxygen content in the material is high), dry etching can be carried out using a fluorine-based gas for the etching gas. However, in the case of carrying out dry etching on a tantalum-based material that demonstrates extensive bonding with oxygen (oxygen content in the material is high) using a chlorine-based gas that does not contain oxygen, an etching rate sufficient for forming a transfer pattern is unable to be obtained.

Since etching gas enabling dry etching of a tantalum-based material and etching gas enabling dry etching of a chromium-based material are not completely identical, it appears at first glance that it is sufficiently possible to fabricate a transfer mask using a mask blank of a laminated structure comprising an absorber film of the aforementioned tantalum-based material and an etching mask film of a chromium-based material. It is possible to a certain extent to form a transfer pattern by dry etching an absorber film of a tantalum-based material using an etching mask film of a chromium-based material in which a transfer pattern has been formed as a mask. However, when the etching mask film is removed after having formed the transfer pattern on the absorber film, it was determined that there is a detrimental effect on the surface of the absorber film or the edges of the pattern of the absorber film become rounded. This problem occurs in the case the etching mask film is stripped by dry etching using a mixed gas of a chlorine-based gas and oxygen gas.

Tantalum-based materials have the property of being dry-etched by a chlorine-based gas. Consequently, this problem occurs since the resistance of the tantalum-based material to dry etching with a mixed gas of a chlorine-based gas and oxygen gas is lower than the case of a molybdenum silicide-based material even in cases in which the oxygen content in a tantalum-based material is comparatively high. If the surface of an absorber film ends up being subjected to the effects of dry etching using a mixed gas of a chlorine-based gas and oxygen gas, absorption performance (optical density) with respect to EUV exposure light ends up decreasing, or optical properties for use as a reflective mask become poor due to a decrease in uniformity of in-plane absorptance distribution (optical density distribution). In addition, if rounding of the pattern edges of the absorber film ends up occurring, this leads to poor line edge roughness of the pattern resulting in a decrease in transfer performance. There are cases in which the absorber film has a two-layer structure, and the upper layer has the function of reducing reflectance with respect to DUV light used during mask examination in the manner of the reflective mask of Patent Literature 1 (JP-A-2002-246299). In the case of such a reflective mask, if the surface of the upper layer of the absorber film is subjected to the effects of dry etching using a mixed gas of a chlorine-based gas and oxygen gas, surface reflectance with respect to DUV light ends up increasing beyond the design value, or uniformity of the distribution of in-plane surface reflectance with respect to DUV light ends up decreasing, thereby creating problems during mask inspection.

Therefore, in consideration of the aforementioned problems, an object of the present invention is to provide a reflective mask blank that allows the fabrication of a reflective mask having a highly precise transfer pattern and an absorber film having favorable optical properties by using a reflective mask blank obtained by laminating an absorber film of tantalum-based material and an etching mask film of a chromium-based material, and to provide a method of manufacturing the reflective mask.

The present invention has the following configurations in order to achieve the aforementioned objects.

(Configuration 1)

Configuration 1 of the present invention is a reflective mask blank used to fabricate a reflective mask that has a laminated structure of a multilayer reflective film, an absorber film and an etching mask film in this order on a substrate, wherein the etching mask film comprises a material containing chromium, the absorber film comprises a material containing tantalum, and a highly oxidized layer having an oxygen content of 60 atomic percent (at %) is formed on the surface layer of the absorber film on the opposite side from the substrate. Use of the mask blank of the present invention makes it possible to fabricate a reflective mask having a highly precise transfer pattern and an absorber film having favorable optical properties.

(Configuration 2)

Configuration 2 of the present invention is the reflective mask blank described in Configuration 1, wherein the oxygen content of the highly oxidized layer is not less than 67 at %. If the oxygen content of the highly oxidized layer is not less than 67 at %, not only does $TaO_2$ bonding become predominant, but the ratio of the $Ta_2O_5$ bonding state is also thought to increase. Thus, in the case of such oxygen content, the $Ta_2O_3$ and $TaO_2$ bonding states are only rarely present, and the unstable TaO bonding state is no longer able to be present.

(Configuration 3)

Configuration 3 of the present invention is the reflective mask blank described in Configuration 1 or Configuration 2, wherein the ratio of the presence of $Ta_2O_5$ bonding in the highly oxidized layer is higher than the ratio of the presence of $Ta_2O_5$ bonding in the absorber film. $Ta_2O_5$ bonding is a bonding state having extremely high stability, and as a result of increasing the ratio of the presence of $Ta_2O_5$ bonding in the highly oxidized layer, resistance to dry etching with a mixed gas of a chlorine-based gas and oxygen gas increases considerably.

(Configuration 4)

Configuration 4 of the present invention is the reflective mask blank described in any of Configurations 1 to 3, wherein the absorber film comprises a material that further contains boron. The absorber film is easily controlled so as to adopt an amorphous structure (non-crystalline structure) if boron is further contained in a material that contains tantalum that forms the absorber film.

(Configuration 5)

Configuration 5 of the present invention is the reflective mask blank described in any of Configurations 1 to 4, wherein the absorber film comprises a material that further contains nitrogen. Oxidation of tantalum can be inhibited by containing nitrogen in an absorber film comprising tantalum.

(Configuration 6)

Configuration 6 of the present invention is the reflective mask blank described in any of Configurations 1 to 4, wherein the absorber film has a laminated structure of a lower layer and an upper layer in this order starting from the side of the substrate, and the highly oxidized layer is formed on the surface layer of the upper layer on the opposite side from the lower layer. As a result of adopting this configuration, the upper layer can be made to function as a film having a function that controls reflectance with respect to inspection light during mask inspection (DUV light).

(Configuration 7)

Configuration 7 of the present invention is the reflective mask blank described in Configuration 6, wherein the oxygen content of the upper layer is less than the oxygen content of the highly oxidized layer. As a result, the total thickness of the absorber film can be further reduced while increasing the optical density obtained by the upper layer, and surface reflectance of the absorber film can be reduced.

(Configuration 8)

Configuration 8 of the present invention is the reflective mask blank described in Configuration 7, wherein the oxygen content of the upper layer is not less than 50 at %. In the case the upper layer with a material that contains tantalum is made to contain oxygen at not less than 50 at %, all of the tantalum in the upper layer is theoretically bound to oxygen. An upper layer having a small amount of tantalum that does not bound to oxygen in this manner has resistance to dry etching with a chlorine-based etching gas without containing oxygen.

(Configuration 9)

Configuration 9 of the present invention is the reflective mask blank described in any of Configurations 6 to 8, wherein the ratio of the presence of $Ta_2O_5$ bonding in the highly oxidized layer is higher than the ratio of the presence of $Ta_2O_5$ bonding in the upper layer. $Ta_2O_5$ bonding is a bonding state having extremely high stability, and as a result of increasing the ratio of the presence of $Ta_2O_5$ bonding in the highly oxidized layer, resistance to dry etching with a mixed gas of a chlorine-based gas and oxygen gas increases considerably.

(Configuration 10)

Configuration 10 of the present invention is the reflective mask blank described in any of Configurations 6 to 9, wherein the oxygen content of the lower layer is less than 10 at %. As a result of considerably suppressing the oxygen content of the lower layer composed of a material containing tantalum, the dry etching rate with a chlorine-based gas without containing oxygen can be increased.

(Configuration 11)

Configuration 11 of the present invention is the reflective mask blank described in any of Configurations 6 to 10, wherein the lower layer comprises a material that contains nitrogen. Oxidation of tantalum can be inhibited by containing nitrogen in a lower layer comprising tantalum.

(Configuration 12)

Configuration 12 of the present invention is the reflective mask blank described in any of Configurations 6 to 11, wherein the oxygen content of the etching mask film is not less than 40 at %. If the oxygen content in the etching mask film is not less than 40 at %, the etching rate with respect to a chlorine-based gas without containing oxygen becomes equal to or more than a prescribed value. As a result, the etching mask film is easily removed simultaneous to dry etching of the lower layer.

(Configuration 13)

Configuration 13 of the present invention is the reflective mask blank described in Configuration 12, wherein the thickness of the etching mask film is not more than 7 nm. If the thickness of the etching mask film is not more than 7 nm, the etching mask film is easily removed simultaneous to dry etching of the lower layer.

(Configuration 14)

Configuration 14 of the present invention is a reflective mask fabricated using the reflective mask blank described in any of Configurations 1 to 13. Use of the reflective mask blank of the present invention makes it possible to obtain a reflective mask having a highly precise transfer pattern and an absorber film having favorable optical properties.

(Configuration 15)

Configuration 15 of the present invention is a method of manufacturing a reflective mask that uses the reflective mask blank described in any of Configurations 1 to 5, comprising the steps of:

forming a resist film having a transfer pattern on the etching mask film;

forming a transfer pattern in the etching mask film by using the resist film in which the transfer pattern has been formed as a mask and dry etching using a mixed gas of a chlorine-based gas and oxygen gas;

forming a transfer pattern in the absorber film by dry etching using the resist film or etching mask film in which the transfer pattern has been formed as a mask; and removing the etching mask film by dry etching using a mixed gas of a chlorine-based gas and oxygen gas after forming the transfer pattern in the absorber film. According to the manufacturing method of the present invention, a reflective mask can be fabricated, which has a highly precise transfer pattern and an absorber film having favorable optical properties.

(Configuration 16)

Configuration 16 of the present invention is a method of manufacturing a reflective mask that uses the reflective mask blank described in any of Configurations 6 to 12, comprising the steps of:

forming a resist film having a transfer pattern on the etching mask film;

forming a transfer pattern in the etching mask film by using the resist film in which the transfer pattern has been formed as a mask and dry etching using a mixed gas of a chlorine-based gas and oxygen gas;

forming a transfer pattern in the upper layer by using the resist film or etching mask film in which the transfer pattern has been formed as a mask, and dry etching using a fluorine-based gas;

forming a transfer pattern in the lower layer by using the resist film, etching mask film or upper layer in which the transfer pattern has been formed as a mask, and dry etching using chlorine-based gas substantially without containing oxygen, and removing the etching mask film by dry etching using a mixed gas of a chlorine-based gas and oxygen gas after forming a transfer pattern in the lower layer. According to the manufacturing method of the present invention, a reflective mask that has a highly precise transfer pattern and an absorber film having favorable optical properties, can be fabricated.

(Configuration 17)

Configuration 17 of the present invention is a method of manufacturing a reflective mask that uses the reflective mask blank described in Configuration 13, comprising the steps of:

forming a resist film having a transfer pattern on the etching mask film;

forming a transfer pattern in the etching mask film by using the resist film having the transfer pattern as a mask and dry etching using a mixed gas of a chlorine-based gas and oxygen gas;

removing the resist film;

forming a transfer pattern in the upper layer by using the etching mask film in which the transfer pattern has been formed as a mask, and dry etching using a fluorine-based gas; and forming a transfer pattern in the lower layer by using the upper layer in which the transfer pattern has been formed as a mask and dry etching using chlorine-based gas substantially without containing oxygen, and removing the etching mask film. According to the manufacturing method of the present invention, a reflective mask that has a highly precise transfer pattern and an absorber film having favorable optical properties, can be fabricated.

In addition, the present invention also has the following configurations in order to achieve the aforementioned objects.

(Configuration 1A)

Configuration 1A of the present invention is a reflective mask blank used to fabricate a reflective mask that has a laminated structure of a multilayer reflective film, an absorber film and an etching mask film in this order on a substrate, wherein the etching mask film comprises a material containing chromium, the absorber film comprises a material containing tantalum, a highly oxidized layer is formed on the surface layer of the absorber film on the opposite side from the substrate, and a Ta 4f narrow spectrum of the highly oxidized layer when analyzed by X-ray photoelectron spectroscopy has a maximum peak at a binding energy of more than 23 eV. Use of the mask blank of the present invention makes it possible to fabricate a reflective mask having a highly precise transfer pattern and an absorber film having favorable optical properties.

(Configuration 2A)

Configuration 2A of the present invention is the reflective mask blank described in Configuration 1A, wherein the Ta 4f narrow spectrum of the portion of the absorber film other than the highly oxidized layer has a maximum peak at a binding energy of not more than 23 eV, when the light shielding film is analyzed by X-ray photoelectron spectroscopy. By controlling the Ta 4f narrow spectrum of the portion of the absorber film other than the highly oxidized layer in this manner, the ratio of the presence of $Ta_2O_5$ in the portion of the absorber film other than the highly oxidized layer can be reduced and optical density can be increased.

(Configuration 3A)

Configuration 3A of the present invention is the reflective mask blank described in Configuration 1A or Configuration 2A, wherein the absorber film comprises a material that does not contain silicon. As a result of not containing silicon, which has properties that is easily bond with oxygen and nitrogen, in the absorber film comprising tantalum, the binding state of elemental tantalum is easily controlled.

(Configuration 4A)

Configuration 4A of the present invention is the reflective mask blank described in any of Configurations 1A to 3A, wherein the absorber film comprises a material that further contains boron. The absorber film is easily controlled to become an amorphous structure (non-crystalline structure) if boron is further contained in a material that contains tantalum that forms the absorber film.

(Configuration 5A)

Configuration 5A of the present invention is the reflective mask blank described in any of Configurations 1A to 4A, wherein the absorber film comprises a material that further contains nitrogen. Oxidation of tantalum can be inhibited by containing nitrogen in an absorber film comprising tantalum.

(Configuration 6A)

Configuration 6A of the present invention is the reflective mask blank described in any of Configurations 1A to 4A, wherein the absorber film has a laminated structure of a lower layer and an upper layer in this order starting from the side of the substrate, and the highly oxidized layer is formed on the surface layer of the upper layer on the opposite side from the lower layer. As a result of adopting this configuration, the upper layer can be made to function as a film having a function that controls reflectance with respect to inspection light during mask inspection (DUV light).

(Configuration 7A)

Configuration 7A of the present invention is the reflective mask blank described in Configuration 6A, wherein the oxygen content of the upper layer is less than the oxygen content of the highly oxidized layer. As a result, the total thickness of the absorber film can be further reduced while increasing the optical density obtained by the upper layer, and surface reflectance of the absorber film can be reduced.

(Configuration 8A)

Configuration 8A of the present invention is the reflective mask blank described in Configuration 7A, wherein the oxygen content of the highly oxidized layer is not less than 67 at % and the oxygen content in the portion of the upper layer other than the highly oxidized layer is not less than 50 at %. In the case the highly oxidized layer with a material that contains tantalum is made to contain oxygen at not less than 67 at %, the ratio of the $Ta_2O_5$ bonding state theoretically increases. In addition, in the case the upper layer with a material that contains tantalum is made to contain oxygen at not less than 50 at %, all of the tantalum in the upper layer is theoretically bound to oxygen. An upper layer having a small amount of tantalum that does not bound to oxygen in this manner has resistance to dry etching with a chlorine-based etching gas without containing oxygen.

(Configuration 9A)

Configuration 9A of the present invention is the reflective mask blank described in any of Configurations 6A to 8A, wherein the ratio of the presence of $Ta_2O_5$ bonding in the highly oxidized layer is higher than the ratio of the presence of $Ta_2O_5$ bonding in the upper layer. $Ta_2O_5$ bonding is a bonding state having extremely high stability, and as a result of increasing the ratio of the presence of $Ta_2O_5$ bonding in the highly oxidized layer, resistance to dry etching with a mixed gas of a chlorine-based gas and oxygen gas increases considerably.

(Configuration 10A)

Configuration 10A of the present invention is the reflective mask blank described in any of Configurations 6A to 9A, wherein the oxygen content of the lower layer is less than 10 at %. As a result of considerably suppressing the oxygen content of the lower layer composed of a material containing tantalum, the dry etching rate with a chlorine-based gas without containing oxygen can be increased.

(Configuration 11A)

Configuration 11A of the present invention is the reflective mask blank described in any of Configurations 6A to 10A, wherein the lower layer comprises a material that contains nitrogen. Oxidation of tantalum can be inhibited by containing nitrogen in a lower layer comprising tantalum.

(Configuration 12A)

Configuration 12A of the present invention is the reflective mask blank described in any of Configurations 6A to 11A, wherein the oxygen content of the etching mask film is not less than 40 at %. If the oxygen content in the etching mask film is not less than 40 at %, the etching rate with respect to a chlorine-based gas without containing oxygen becomes equal to or more than a prescribed value. As a result, the etching mask film is easily removed simultaneous to dry etching of the lower layer.

(Configuration 13A)

Configuration 13A of the present invention is the reflective mask blank described in Configuration 12A, wherein the thickness of the etching mask film is not more than 7 nm. If the thickness of the etching mask film is not more than 7 nm, the etching mask film is easily removed simultaneous to dry etching of the lower layer.

(Configuration 14A)

Configuration 14A of the present invention is a reflective mask fabricated using the reflective mask blank described in any of Configurations 1A to 13A. Use of the reflective mask blank of the present invention makes it possible to obtain a reflective mask having a highly precise transfer pattern and an absorber film having favorable optical properties.

(Configuration 15A)

Configuration 15A of the present invention is a method of manufacturing a reflective mask that uses the reflective mask blank described in any of Configurations 1A to 5A, comprising the steps of:

forming a resist film having a transfer pattern on the etching mask film;

forming a transfer pattern in the etching mask film by using the resist film in which the transfer pattern has been formed as a mask and dry etching using a mixed gas of a chlorine-based gas and oxygen gas;

forming a transfer pattern in the absorber film by dry etching using the resist film or etching mask film in which the transfer pattern has been formed as a mask; and removing the etching mask film by dry etching using a mixed gas of a chlorine-based gas and oxygen gas after having formed a transfer pattern in the absorber film. According to the manufacturing method of the present invention, a reflective mask that has a highly precise transfer pattern and an absorber film having favorable optical properties, can be fabricated.

(Configuration 16A)

Configuration 16A of the present invention is a method of manufacturing a reflective mask that uses the reflective mask blank described in any of Configurations 6A to 12A, comprising the steps of:

forming a resist film having a transfer pattern on the etching mask film;

forming a transfer pattern in the etching mask film by using the resist film having the transfer pattern as a mask and dry etching using a mixed gas of a chlorine-based gas and oxygen gas;

forming a transfer pattern in the upper layer by using the resist film or etching mask film in which the transfer pattern has been formed as a mask, and dry etching using a fluorine-based gas;

forming a transfer pattern in the lower layer by using the resist film, etching mask film or upper layer in which the transfer pattern has been formed as a mask, and dry etching using chlorine-based gas substantially without containing oxygen; and removing the etching mask film by dry etching using a mixed gas of a chlorine-based gas and oxygen gas after having formed a transfer pattern in the lower layer. According to the manufacturing method of the present invention, a reflective mask that has a highly precise transfer pattern and an absorber film having favorable optical properties, can be fabricated.

(Configuration 17A)

Configuration 17A of the present invention is a method of manufacturing a reflective mask that uses the reflective mask blank described in Configuration 13A, comprising the steps of:

forming a resist film having a transfer pattern on the etching mask film;

forming a transfer pattern in the etching mask film by using the resist film having the transfer pattern as a mask and dry etching using a mixed gas of a chlorine-based gas and oxygen gas;

removing the resist film;

forming a transfer pattern in the upper layer by using the etching mask film in which the transfer pattern has been formed as a mask, and dry etching using a fluorine-based gas; and forming a transfer pattern in the lower layer by using the upper layer in which the transfer pattern has been formed as a mask and dry etching using chlorine-based gas substantially without containing oxygen, and removing the etching mask film. According to the manufacturing method of the present invention, a reflective mask that has a highly precise transfer pattern and an absorber film having favorable optical properties, can be fabricated.

According to the present invention, a reflective mask blank, which allows the fabrication of a reflective mask that has a highly precise transfer pattern and an absorber film having favorable optical properties by using a reflective mask blank obtained by laminating an absorber film of a tantalum-based material and an etching mask film of a chromium-based material, and a method of manufacturing the reflective mask, can be obtained.

More specifically, the reflective mask blank of the present invention has an absorber film composed of a material containing tantalum, and has a highly oxidized layer having an oxygen content of not less than 60 at % is formed on the surface layer of the absorber film on the opposite side from a substrate. The reflective mask blank adopts a structure in which an etching mask film composed of a material containing chromium is formed on the absorber film. A mask blank adopting such a structure makes it possible to fabricate a reflective mask having favorable optical properties for the absorber film pattern even if the etching mask film is stripped by dry etching using a mixed gas of a chlorine-based gas and oxygen gas after forming a transfer pattern in the absorber film. In addition, a reflective mask can be fabricated that has favorable line edge roughness of a transfer pattern formed in the absorber film.

More specifically, the reflective mask blank of the present invention has an absorber film composed of a material containing tantalum, and a highly oxidized layer is formed on the surface layer of the absorber film on the opposite side from a substrate, the Ta 4f narrow spectrum of the highly oxidized layer analyzed by X-ray photoelectron spectroscopy has a maximum peak at a binding energy of more than 23 eV. The reflective mask blank adopts a structure in which an etching mask film composed of a material containing chromium is formed on the absorber film. The use of a reflective mask blank adopting such a structure makes it possible to fabricate a reflective mask having favorable optical properties of the absorber film pattern even if the etching mask film is stripped by dry etching using a mixed gas of a chlorine-based gas and oxygen gas after forming a transfer pattern in the absorber film. In addition, a reflective mask that has favorable line edge roughness of a transfer pattern formed in the absorber film, can be fabricated.

DETAILED DESCRIPTION OF THE INVENTION

Figure 1:
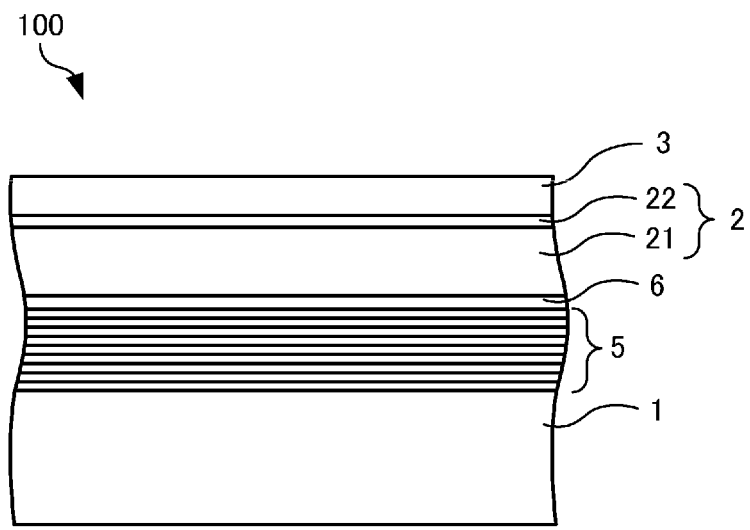
FIG. 1 is a cross-sectional view showing the configuration of a reflective mask blank in a first embodiment of the present invention.

The following provides an explanation of various embodiments of the present invention.

The inventors of the present invention conducted extensive studies to solve problems occurring in the case of fabricating a reflective mask using a reflective mask blank obtained by laminating an etching mask film composed of a material containing chromium on an absorber film composed of a material containing tantalum. The problems are degradation of poor optical properties of the absorber film (including poor optical density and surface reflectance with respect to mask inspection light) as a result of the surface of the absorber film on the side of the etching mask film being affected by dry etching with a mixed gas of a chlorine-based gas and oxygen gas that is carried out during removal of the etching mask film, and poor line edge roughness of the pattern of the absorber film due to rounding of the edges thereof. As a result of these studies, the inventors of the present invention determined that if a material containing tantalum has an oxygen content of at least 60 atomic percent (at %), resistance to dry etching with a mixed gas of a chlorine-based gas and oxygen gas can be adequately enhanced. In addition, it was determined that an absorber film formed with a material containing tantalum having an oxygen content of at least 60 at % is able to inhibit the effects on optical properties and rounding of pattern edges. However, the absorber film is required to be optical density equal to or more than a prescribed value (such as an optical density of not less than 2.5). On the other hand, since miniaturization of transfer patterns is progressing, it is also necessary to reduce the thickness of the absorber film. If the entire absorber film is formed with a material having a high oxygen content in this manner, it becomes necessary to increase the thickness of the absorber film in order to obtain optical density equal to or more than a prescribed value.

In consideration of the above, the reflective mask blank in a first embodiment of the present invention is characterized by being a reflective mask blank used to fabricate a reflective mask and having a structure in which a multilayer reflective film, an absorber film and an etching mask film are laminated in this order on a substrate, wherein the etching mask film comprises a material containing chromium, the absorber film comprises a material containing tantalum, and a highly oxidized layer having an oxygen content of not less than 60 at % is formed on the surface layer of the absorber film on the opposite side from the substrate.

It is desired that the crystal structure of the thin film in the reflective mask blank and the reflective mask is microcrystalline and preferably amorphous. Consequently, the crystal structure within the absorber film is unlikely to become a single structure, and easily becomes a state comprising a mixture of a plurality of crystal structures. Namely, in the case the material containing tantalum is a highly oxidized layer, the crystal structure easily becomes a state comprising a mixture of TaO bonding, $Ta_2O_3$ bonding, $TaO_2$ bonding and $Ta_2O_5$ bonding (mixed crystalline state). As the ratio of the presence of $Ta_2O_5$ bonding increases in a prescribed surface layer in the absorber film, resistance to dry etching with a mixed gas of a chlorine-based gas and oxygen gas tends to improve. In addition, as the ratio of the presence of $Ta_2O_5$ bonding in a prescribed surface layer of the absorber film increases, characteristics that inhibit hydrogen penetration, chemical resistance and hot water resistance also tend to increase.

If the oxygen content in the highly oxidized layer is 60 at % to less than 66.7 at %, there is thought to be an increasingly high tendency for the bonding state between tantalum and oxygen in the highly oxidized layer to comprise mainly of $Ta_2O_3$ bonding, while the presence of the most unstable form of bonding in the form of TaO bonding is thought to be extremely low in comparison with the case of an oxygen content in that layer of less than 60 at %. If the oxygen content in the highly oxidized layer is not less than 66.7 at %, it is thought that there is an increasingly high tendency with comprising mainly of $TaO_2$ for the bonding state between tantalum and oxygen in the highly oxidized layer, while the presence of the most unstable forms of bonding in the form of TaO bonding and the second most unstable bonding of $Ta_2O_3$ bonding are thought to be extremely low.

If the oxygen content in the highly oxidized layer is not less than 67 at %, it is considered that not only $TaO_2$ becomes the main bonding state but also the ratio of the $Ta_2O_5$ bonding state is increased. In the case of this oxygen content, the $Ta_2O_3$ and $TaO_2$ bonding states are only rarely present, while the TaO bonding state is no longer able to be present. If the oxygen content in the highly oxidized layer reaches 71.4 at %, the highly oxidized layer is thought to be substantially formed only in the $Ta_2O_5$ bonding state. If the oxygen content of the highly oxidized layer is not less than 60 at %, bonding comprises not only the most stable $Ta_2O_5$ bonding state, but also includes the $Ta_2O_3$ and $TaO_2$ bonding states. Consequently, as a result of making the lower limit of oxygen content in the highly oxidized layer 60 at %, the most unstable form of bonding in the form of TaO bonding is thought to be extremely low and it does not have an effect that causes decreases in resistance to dry etching with a mixed gas of a chlorine-based gas and oxygen gas, characteristics that inhibit hydrogen penetration or chemical resistance.

The ratio of the presence of $Ta_2O_5$ bonding in the highly oxidized layer is preferably higher than the ratio of the presence of $Ta_2O_5$ bonding in the absorber film. $Ta_2O_5$ bonding is a bonding state having extremely high stability, and by increasing the ratio of the presence of $Ta_2O_5$ bonding in the highly oxidized layer, resistance to dry etching with a mixed gas of a chlorine-based gas and oxygen gas increases considerably. In addition, resistance to mask washing, such as characteristics that inhibit hydrogen penetration, chemical resistance and resistance related to mask washing, such as hot water resistance increase considerably. In particular, the highly oxidized layer is most preferably formed in the $Ta_2O_5$ bonding state only. Furthermore, the highly oxidized layer preferably only contains nitrogen and other elements within a range that does not have an effect on these functions and effects, and are preferably substantially not contained.

On the other hand, as a result of conducting extensive studies on the highly oxidized layer formed on the surface layer on the opposite side from the substrate, the inventors of the present invention determined that the various problems previously described can be solved by forming the highly oxidized layer that has the Ta 4f narrow spectrum when analyzed by X-ray photoelectron spectroscopy (XPS) having a maximum peak at a binding energy of more than 23 eV. Materials having a high binding energy tend to have improved resistance to dry etching with a mixed gas of a chlorine-based gas and oxygen gas. In addition, characteristics that inhibit hydrogen penetration, chemical resistance and hot water resistance also tend to increase. The bonding state that has the highest binding energy in tantalum compounds is $Ta_2O_5$ bonding. As was previously described, the crystal structure of the thin film in the reflective mask blank and the reflective mask is unlikely to become a single structure, and easily becomes a state comprising a mixture of a plurality of crystal structures.

As the ratio of the presence of $Ta_2O_5$ bonding in the highly oxidized layer increases, the above-mentioned various properties improve. As previously described, the ratio of the presence of $Ta_2O_5$ bonding can be promoted to increase by controlling the oxygen content therein. However, in order to more reliably form a highly oxidized layer having a high ratio of the presence of $Ta_2O_5$ bonding, it is better to control the oxygen content by analyzing the actually formed highly oxidized layer by X-ray photoelectron spectroscopy and observing the Ta 4f narrow spectrum. For example, a plurality of conditions is set for the deposition conditions of a sputter deposition system and treatment conditions of surface treatment for forming the highly oxidized layer, and reflective mask blanks in which a highly oxidized layer is formed on the surface layer of the absorber film are respectively produced under each condition. The highly oxidized layer of each reflective mask blank is then analyzed by X-ray photoelectron spectroscopy to observe the Ta 4f narrow spectrum, conditions for forming a highly oxidized layer having high binding energy are selected, and a reflective mask blank provided with a highly oxidized layer formed under the selected conditions is produced on the surface layer of the absorber film. In a reflective mask blank fabricated in this manner, the ratio of the presence of $Ta_2O_5$ bonding in the highly oxidized layer formed on the surface layer of the absorber film is reliably increased.

The Ta 4f narrow spectrum of the highly oxidized layer of the mask blank of the present invention analyzed by X-ray photoelectron spectroscopy has a maximum peak at a binding energy of more than 23 eV. This is because it is less likely for $Ta_2O_5$ bonding is present in a material containing tantalum in which the maximum peak of the binding energy is not more than 23 eV. The maximum peak of the binding energy in the Ta 4f narrow spectrum of the highly oxidized layer of the mask blank of the present invention analyzed by X-ray photoelectron spectroscopy is preferably not less than 24 eV, more preferably not less than 25 eV and particularly preferably not less than 25.4 eV. If the maximum peak of the binding energy of the highly oxidized layer is not less than 25 eV, the bonding state between tantalum and oxygen in the highly oxidized layer comprises mainly of $Ta_2O_5$ bonding, and resistance to dry etching with a mixed gas of a chlorine-based gas and oxygen gas increases considerably.

In the mask blank of the present invention, the Ta 4f narrow spectrum of the portion of the absorber film other than the highly oxidized layer analyzed by X-ray photoelectron spectroscopy preferably has a maximum peak at a binding energy of not more than 23 eV. As the binding energy of the Ta 4f narrow spectrum increases, the ratio of bonding between tantalum and oxygen in the absorber film increases and optical density of the absorber film per unit thickness with respect to exposure light ends up decreasing. Consequently, the thickness of the absorber film required to obtain a prescribed optical density increases, thereby making this undesirable. The maximum peak of binding energy in the portion of the absorber film other than the highly oxidized layer is more preferably not more than 22.6 eV and even more preferably not more than 22 eV.

In the mask blank of the present invention, the absorber film is preferably composed of a material that does not contain silicon. This is because, as a result of not containing silicon that has properties of easily bonding with oxygen and nitrogen in the absorber film containing tantalum, it can be made easier to control the bonding state between elemental tantalum and oxygen in the highly oxidized layer in particular. In addition, in the case of using a chlorine-based gas for the etching gas used during dry etching carried out, when a transfer pattern is formed in the absorber film, the etching rate decreases considerably if chlorine is contained in the absorber film, thereby making this undesirable.

The thickness of the highly oxidized layer of the mask blank of the present invention is preferably 1.5 nm to 4 nm. In the case the thickness of the highly oxidized layer is less than 1.5 nm, the highly oxidized layer becomes excessively thin and cannot be expected to demonstrate the effects, while if the thickness of the highly oxidized layer exceeds 4 nm, the effect on surface reflectance with respect to mask inspection light becomes great, and control for obtaining a prescribed surface reflectance becomes difficult. In addition, since the highly oxidized layer has a low absorptance with respect to EUV exposure light, this ends up having a negative effect from the viewpoint of decreasing the thickness of the absorber film. Furthermore, in consideration of balance between the viewpoint of securing optical density throughout the entire absorber film and the viewpoint of improving characteristics that inhibit hydrogen penetration and chemical resistance, the thickness of the highly oxidized layer is more preferably 1.5 nm to 3 nm.

Examples of methods used to form the highly oxidized layer include carrying out hot water treatment, ozone water treatment, heat treatment in air containing oxygen, ultraviolet irradiation treatment in air containing oxygen and $O_2$ plasma treatment on the mask blank after the deposition of the absorber film.

Examples of tantalum-containing materials that form the absorber film include tantalum metal and materials containing one or more elements selected from the group consisting of nitrogen, oxygen, boron and carbon in tantalum but substantially without containing hydrogen. Examples of these materials include Ta, TaN, TaON, TaBN, TaBON, TaCN, TaCON, TaBCN and TaBOCN. The aforementioned materials may also contain metals other than tantalum within a range that allows the effects of the present invention to be obtained. The containing of boron in the material containing tantalum that forms the absorber film facilitates control the structure thereof to be an amorphous (non-crystalline) structure.

The absorber film of the mask blank is preferably formed with a material containing tantalum and nitrogen. Tantalum is a material that is susceptible to natural oxidation. As oxidation progresses, the absorption performance of tantalum with respect to EUV exposure light decreases. In addition, from the viewpoint of forming an absorber film pattern, in the case of being in a state in which oxidation has not progressed, tantalum can be said to be a material that can be dry etched with either an etching gas containing a fluorine-based gas (fluorine-based etching gas) or an etching gas containing a chlorine-based gas but without oxygen (oxygen-free, chlorine-based etching gas). However, from the viewpoint of forming an absorber film pattern, tantalum in which oxidation has progressed can be said to be a material for which dry etching is difficult with an oxygen-free, chlorine-based etching gas, and can only be dry etched with a fluorine-based etching gas. Oxidation of tantalum can be inhibited by containing nitrogen in the tantalum. From the viewpoint of optical density, the nitrogen content in the absorber film is preferably not more than 30 at %, more preferably not more than 25 at %, and even more preferably not more than 20 at %. The nitrogen content in the absorber film is also preferably not less than 5 at %.

Examples of chromium-containing materials that form the etching mask film include materials containing one or more elements selected from the group consisting of nitrogen, oxygen, carbon and boron in chromium. Examples of these materials include CrN, CrON, CrCN, CrCON, CrBN, CrBON, CrBCN and CrBOCN. The aforementioned materials may also contain metals other than chromium within a range that allows the effects of the present invention to be obtained. From the viewpoint of allowing functioning as an etching mask in which a transfer pattern is precisely formed in the absorber film, the thickness of the etching mask film is preferably not less than 3 nm. In addition, from the viewpoint of reducing the thickness of the resist film, the thickness of the etching mask film is preferably not more than 15 nm.

Examples of the substrate in the reflective mask blank include synthetic quartz glass, quartz glass, aluminosilicate glass, soda lime glass, low thermal expansion glass (such as $SiO_2$—$TiO_2$ glass), crystallized glass obtained by precipitating a β-quartz solid solution, single crystal silicon and SiC. The temperature of the multilayer reflective film of the reflective mask rises when EUV exposure light is irradiated. If low thermal expansion glass, such as $SiO_2$—$TiO_2$ glass, is used, expansion of the substrate accompanying the rise in temperature can be inhibited. Thus, the material of the substrate used in the reflective mask is preferably low thermal expansion glass.

The multilayer reflective film is a multilayer film obtained by laminating a plurality of periods of layers comprising a low refractive index layer composed of a low refractive index material having a low refractive index with respect to EUV light, and a high refractive index layer composed of a high refractive index material having a high refractive index with respect to EUV light. Normally, the low refractive index layers are formed with a light element or compound thereof, while the high refractive index layers are formed with a heavy element of a compound thereof. The number of periods of the multilayer reflective film is preferably 20 to 60 periods and more preferably 30 to 50 periods. In the case of using EUV light having a wavelength of 13 nm to 14 nm for the exposure light, a multilayer film obtained by alternately laminating 20 to 60 periods of Mo layers and Si layers can be used preferably for the multilayer reflective film. In addition, examples of other multilayer reflective films applicable to EUV light include an Si/Ru periodic multilayer film, Be/Mo periodic multilayer film, Si compound/Mo compound periodic multilayer film, Si/Nb periodic multilayer film, Si/Mo/Ru periodic multilayer film, Si/Mo/Ru/Mo periodic multilayer film and Si/Ru/Mo/Ru periodic multilayer film. The materials and film thickness of each layer can be suitably selected corresponding to the wavelength band of the EUV light used. The multilayer reflective film is preferably deposited by a sputtering method (such as DC sputtering, RF sputtering or ion beam sputtering). Ion beam sputtering is particularly preferable since it facilitates control of film thickness.

A protective layer can be provided between the multilayer reflective film and the absorber film in the aforementioned reflective mask blank. The protective layer fulfills the role of protecting the multilayer reflective from damage when dry etching is carried out to form a transfer pattern on the absorber film. In addition, it also fulfills the role of protecting the surface of the multilayer reflective film from oxidation after fabricating the reflective mask. Examples of materials of the protective layer include Ru metal as well as Ru alloys (alloys of Ru and at least one element such as Nb, Zr, Mo, Y, B or La). The thickness of the protective layer is preferably selected to be within the range of 0.8 nm to 5 nm. Because the absorptance of the protective layer with respect to EUV light is low, the protective layer is allowed to remain on those portions that do not have an absorber film pattern in the state after completion of the reflective mask.

A buffer layer can also be provided between the multilayer reflective film and the absorber film in the aforementioned reflective mask blank. The buffer layer fulfills the role of protecting the multilayer reflective from damage when dry etching is carried out to form a transfer pattern on the absorber film. In addition, it also fulfills the role of protecting the multilayer reflective film from defect correction carried out in the case opaque defects and/or clear defects have generated in the absorber film pattern during fabrication of the reflective mask. Examples of the material of the buffer layer include the aforementioned chromium-based materials. The thickness of the buffer layer is preferably about 20 nm to 60 nm in the case a focused ion beam (FIB) is used for defect correction. In addition, the thickness of the buffer layer is preferably 5 nm to 15 nm in the case of carrying out defect correction (EB correction) using an electron beam and a non-excited fluorine-based gas (such as $Xe_2F$). Since the buffer layer has comparatively large absorptance with respect to EUV light, it is also necessary to remove the buffer layer directly below those portions where the absorber film is removed (spaces of the transfer pattern) when the reflective mask is fabricated.

In the aforementioned reflective mask blank, a conductive film can be formed on the main surface (back surface) on the opposite side from the main surface of the substrate on which the multilayer reflective film is formed. In the case of an exposure apparatus using EUV light for the exposure light source, there are many cases in which the reflective mask is fixed to a mask stage by electrostatic chucking of the back surface thereof. Consequently, in the case of using a material having low electrical conductivity for the substrate, a conductive film having electrical conductivity is preferably formed on the back side of the substrate. Although a chromium-based material or tantalum-based material can be used for the material of the conductive film, the content of an element that decreases electrical conductivity (such as oxygen or nitrogen) is preferably low.

A method of manufacturing a reflective mask, which uses the reflective mask blank of the first embodiment of the present invention is characterized by having a step for forming a resist film having a transfer pattern on an etching mask film, a step for forming a transfer pattern in the etching mask film by using the resist film in which the transfer pattern has been formed as a mask and dry etching using a mixed gas of a chlorine-based gas and oxygen gas, a step for forming a transfer pattern in the absorber film by using the resist film or etching mask film in which the transfer pattern has been formed as a mask and dry etching using a fluorine-based gas, and a step for removing the etching mask film by dry etching using a mixed gas of a chlorine-based gas and oxygen gas after having formed a transfer pattern in the absorber film.

FIG. 1 is a cross-sectional view showing the configuration of a reflective mask blank 100 in a first embodiment of the present invention. In addition, FIGS. 2A to 2F are cross-sectional views showing the production process of a reflective mask 200 using the reflective mask blank 100. This reflective mask blank 100 has a configuration in which a multilayer reflective film 5, a protective layer 6, an absorber film 2 and an etching mask film 3 are laminated in this order on a substrate 1. In addition, a highly oxidized layer 22 is formed on the surface layer of the absorber film 2 on the opposite side from the substrate 1 (side toward to the etching mask film 3). The portion of the absorber film 2 excluding the highly oxidized layer 22 is an absorber film body 21. The details of each configuration of the reflective mask blank 100 are as previously described. The following provides an explanation of a method of manufacturing the reflective mask in accordance with the production process shown in FIG. 2.

Figure 2A:
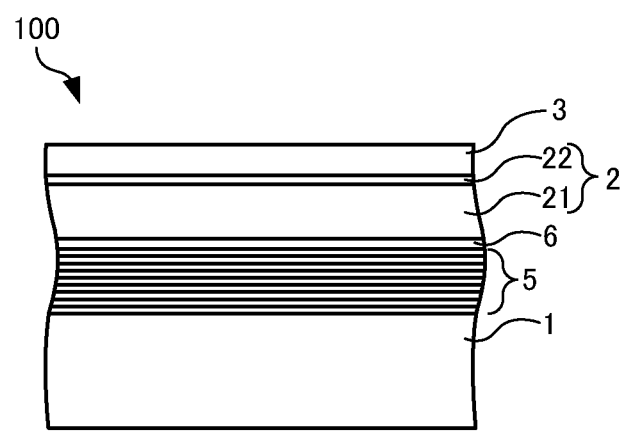
FIGS. 2A to 2F are cross-sectional views showing the manufacturing process of a reflective mask in a first embodiment of the present invention.
Figure 2B:
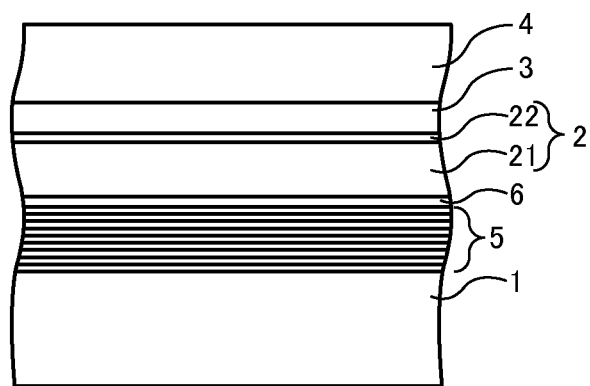
Figure 2C:
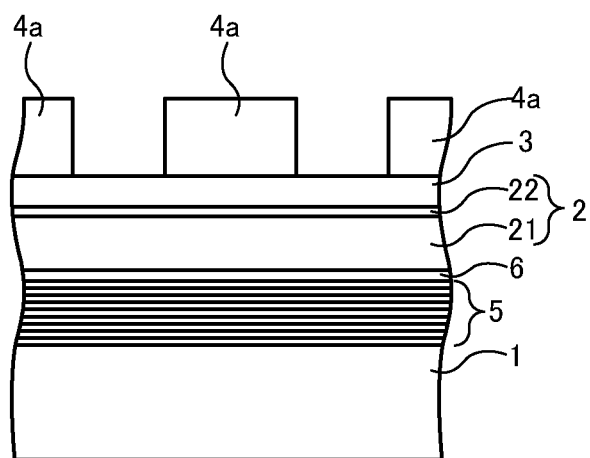
Figure 2D:
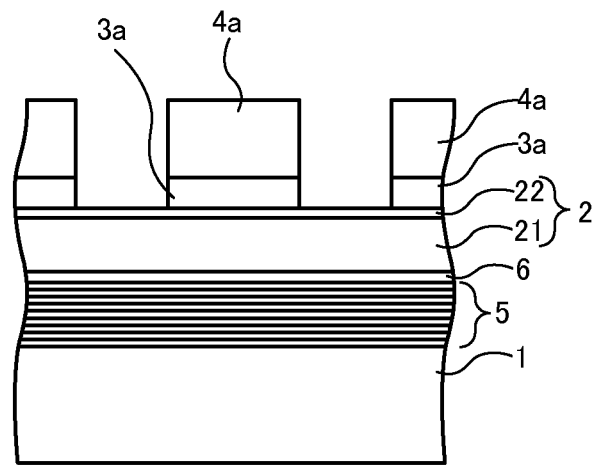
Figure 2E:
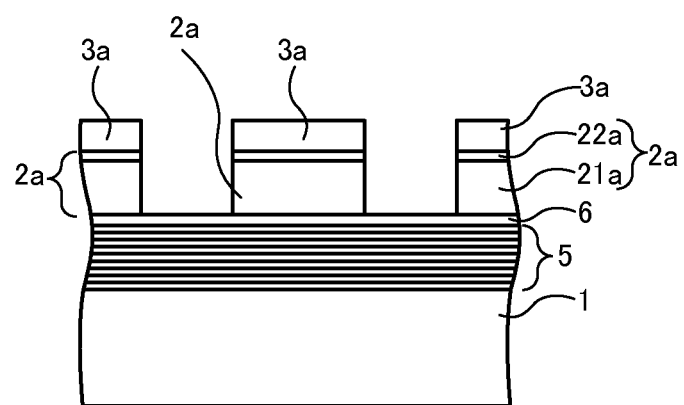
Figure 2F:
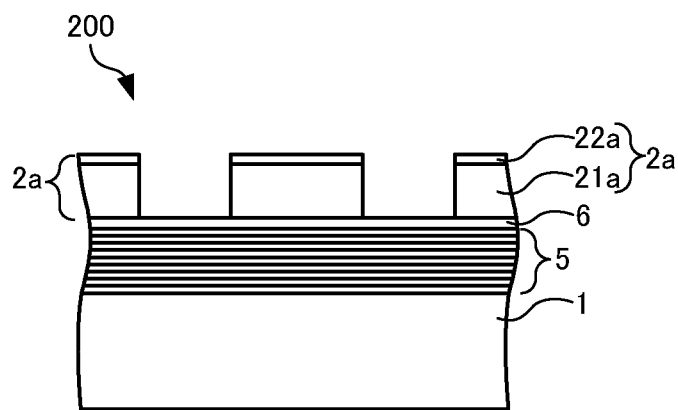

First, a resist film 4 is formed on the etching mask film 3 of the reflective mask blank 100 (see FIG. 2B). Next, a desired transfer pattern is formed by exposure drawing on the resist film 4 followed by carrying out prescribed treatment such as development treatment to form the resist film 4 having a transfer pattern (resist pattern 4a) (see FIG. 2C). Continuing, a transfer pattern is formed on the etching mask film 3 (etching mask pattern 3a) by using the resist pattern 4a as a mask and carrying out dry etching using a mixed gas of a chlorine-based gas and oxygen gas (see FIG. 2D). Next, the resist pattern 4a is removed, and dry etching is carried out using a fluorine-based gas by using the etching mask pattern 3a as a mask to form a transfer pattern (absorber film pattern 2a) on the absorber film 2 (the highly oxidized layer 22 and the absorber film body 21) (see FIG. 2E). Furthermore, the resist pattern 4a may be allowed to remain when dry etching is carried out on the absorber film 2. In that case, the resist pattern 4a is removed after having formed the absorber film pattern 2a. After having formed the absorber film pattern 2a, dry etching is carried out using a mixed gas of a chlorine-based gas and oxygen gas to remove the etching mask pattern 3a followed by undergoing a desired treatment such as washing to obtain the reflective mask 200 (see FIG. 2F).

As was previously described, the surface of the absorber film 2 (highly oxidized layer 22) has high resistance even if dry etching is carried out using a mixed gas of a chlorine-based gas and oxygen gas when the etching mask pattern 3a is removed. Consequently, optical properties of the absorber film pattern 2a of the fabricated reflective mask 200 are favorable. In addition, the line edge roughness of the absorber film pattern 2a is also favorable. Furthermore, although the absorber film pattern 2a was formed by carrying out dry etching using a fluorine-based gas on the absorber film 2, dry etching using a chlorine-based gas may also be applied.

There are no particular limitations on the chlorine-based gas used in the aforementioned dry etching, if the chlorine-based gas contains chlorine (Cl). Examples of such gases include $Cl_2$, $SiCl_2$, $CHCl_3$, $CH_2Cl_2$, $CCl_4$ and $BCl_3$. In addition, there are also no particular limitations on the fluorine-based gas used in the aforementioned dry etching, if the fluorine-based gas contains fluorine (F). Examples of fluorine-based gases used in dry etching include $CHF_3$, $CF_4$, $C_2F_6$, $C_4F_8$ and $SF_6$.

Furthermore, in the aforementioned method of manufacturing the reflective mask, after forming a transfer pattern on the etching mask film 3, dry etching for forming a transfer pattern on the absorber film 2 is preferably carried out after removing the resist pattern 4a. Since transfer patterns are of a fine size, the resist film 4 is preferably as thin as possible. If dry etching is carried out on the absorber film 2 with the resist pattern 4a remaining after having patterned the etching mask film 3 with a thin resist pattern 4a, there is the risk of the resist pattern 4a being lost during etching of the absorber film 2. If a resist pattern 4a of an organic material is present during dry etching, carbon and/or oxygen are generated when the resist pattern 4a is etched, and they have an effect on the etching environment when dry etching of the absorber film 2 is carried out. If the resist pattern 4a containing carbon and/or oxygen is lost at an intermediate point during dry etching of the absorber film 2, the etching environment ends up changing during the course of dry etching, thereby resulting in the risk of having a detrimental effect on pattern precision (such as the precision of the shape of pattern sidewalls or in-plane CD precision), and making this undesirable.

In addition, since the etching gas used when dry etching the etching mask film 3 and the etching gas used when dry etching the absorber film 2 are different, etching is frequently carried out in separate etching chambers. The generation of carbon and oxygen originating in the resist pattern can cause the occurrence of defects during dry etching. Consequently, after having patterned the etching mask film 3, the reflective mask blank 100 is preferably introduced into an etching chamber for dry etching the absorber film 2 after having removed the resist pattern 4a.

A reflective mask blank in a second embodiment of the present invention adopts a configuration in which the absorber film in the reflective mask blank of the first embodiment has a structure in which a lower layer and an upper layer are laminated starting from the side of a substrate, and a highly oxidized layer is formed on the surface layer of the upper layer on the opposite side from the lower layer. When such a configuration is adopted, the upper layer can be made to function as a film having a function that controls surface reflectance with respect to inspection light during mask inspection (DUV light). The specific configuration, functions and effects relating to the highly oxidized layer are the same as in the reflective mask blank of the first embodiment. In addition, the specific configuration relating to the substrate is also the same as that of the reflective mask blank of the first embodiment.

The oxygen content of the upper layer is preferably lower than the oxygen content of the highly oxidized layer. As a result of adopting such a configuration for the absorber film, the overall thickness of the absorber film can be further reduced while increasing the optical density obtained by the upper layer, thereby making it possible to also reduce absorptance of the absorber film with respect to inspection light. When considering ease of controlling surface reflectance properties with respect to inspection light, the oxygen content of the upper layer is preferably less than 60 at %.

The oxygen content of the upper layer is preferably not less than 50 at %. It is desired that the crystal structure of the absorber film in the reflective mask blank and the reflective mask is microcrystalline and preferably amorphous. Consequently, the crystal structure within the absorber film is unlikely to become a single structure, and easily becomes a state comprising a mixture of a plurality of crystal structures. Namely, in the case of a highly oxidized layer of a material containing tantalum, the crystal structure easily becomes a state comprising oxygen and unbound Ta, TaO bonding, $Ta_2O_3$ bonding, $TaO_2$ bonding and $Ta_2O_5$ bonding (mixed crystalline state). In the case oxygen in the upper layer with the material that contains tantalum is contained at not less than 50 at %, theoretically all of the tantalum in the upper layer is bound to oxygen. The ratio of presence of tantalum without bonding to oxygen in the upper layer can be decreased considerably even in a mixed crystalline state as described above. The upper layer which contains little tantalum without bonding to oxygen in this manner has resistance to dry etching with an oxygen-free, chlorine-based etching gas.

The oxygen content of the highly oxidized layer is preferably not less than 67 at %, and the oxygen content in the portion of the upper layer other than the highly oxidized layer is preferably not less than 50 at %. In the case of containing oxygen at not less than 50 at % in the upper layer with a material that contains tantalum, theoretically all of the tantalum in the upper layer is bounding to oxygen. An upper layer having little tantalum without bonding to oxygen in this manner has resistance to dry etching with an oxygen-free, chlorine-based etching gas. Moreover, if oxygen is contained at not less than 67 at % in the highly oxidized layer with a material that contains tantalum, theoretically the ratio of the $Ta_2O_5$ bonding state increases. As a result of providing a highly oxidized layer having a high ratio of the Ta$_2$O$_5$ bonding state on the surface layer of the upper layer, resistance of the surface of the upper layer to dry etching gas comprising a mixed gas of a chlorine-based gas and oxygen gas increases considerably. In particular, in the case of imparting an antireflection function to the upper layer, changes in surface reflectance can be inhibited after having carried out dry etching for removing the etching mask film of a chromium-based material.

The ratio of the presence of Ta$_2$O$_5$ bonding in the highly oxidized layer is preferably higher than the ratio of the presence of Ta$_2$O$_5$ bonding in the upper layer. Functions and effects are obtained that are similar to the case of the reflective mask blank of the first embodiment. In addition, the oxygen content of the lower layer is preferably less than 10 at %. As a result of greatly reducing the oxygen content of the lower layer composed of a material containing tantalum, the dry etching rate with an oxygen-free, chlorine-based gas can be increased.

The thickness of the resist film can be further reduced by combining an upper layer having an oxygen content of not less than 50 at % and a lower layer having an oxygen content of less than 10 at %. In contrast to the upper layer being difficult to dry etch with an oxygen-free, chlorine-based gas, the lower layer can be sufficiently dry etched with an oxygen-free, chlorine-based gas. Consequently, a transfer pattern can be formed in the lower layer by using the upper layer in which a transfer pattern has been formed as a mask and carrying out dry etching with an oxygen-free, chlorine-based gas. In the case of such a configuration of the absorber film, it is not essential for the resist pattern to remain until transfer patterns can be formed in both the upper layer and lower layer.

The material that forms the lower layer is the same as the material that forms the absorber film of the reflective mask blank of the first embodiment. In addition, the material that forms the upper layer contains tantalum, and preferably further contains nitrogen, boron or carbon and the like. Examples of such materials include TaO, TaON, TaBO, TaBON, TaCO, TaCON, TaBCO and TaBOCN.

The lower layer is preferably formed with a material that contains tantalum and nitrogen. Functions, effects and the preferable nitrogen content resulting from the use of such a configuration are the same as in the absorber film of the reflective mask blank of the first embodiment.

A method of manufacturing a reflective mask, which uses the reflective mask blank of the second embodiment of the present invention is characterized by having a step for forming a resist film having a transfer pattern on an etching mask film, a step for forming a transfer pattern in the etching mask film by using the resist film in which the transfer pattern has been formed as a mask and dry etching using a mixed gas of a chlorine-based gas and oxygen gas, a step for forming a transfer pattern in an upper layer by using the resist film or etching mask film in which a transfer pattern has been formed as a mask and dry etching using a fluorine-based gas, a step for forming a transfer pattern in a lower layer by using the resist film, etching mask film or upper layer in which a transfer pattern has been formed as a mask and dry etching using a chlorine-based gas substantially free of oxygen, and a step for removing the etching mask film by dry etching using a mixed gas of a chlorine-based gas an oxygen gas after having formed a transfer pattern in the lower layer.

Figure 3:
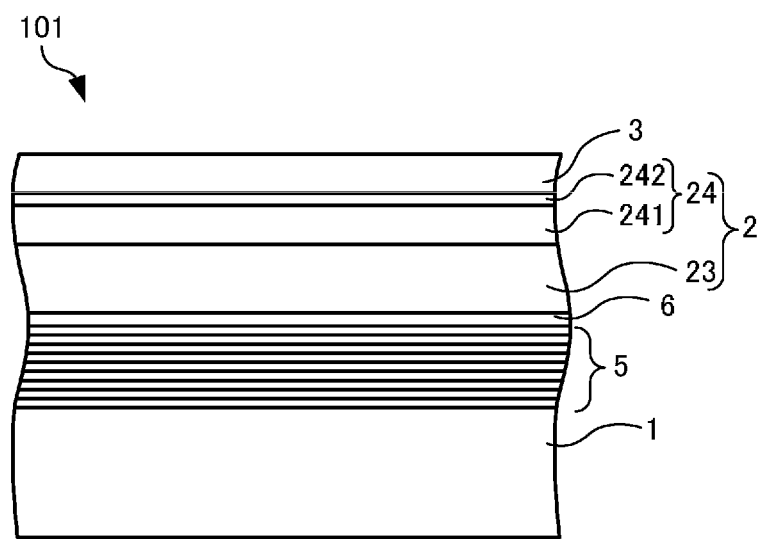
FIG. 3 is a cross-sectional view showing the configuration of a reflective mask blank in a second embodiment of the present invention.

FIG. 3 is a cross-sectional view showing the configuration of a reflective mask blank 101 in a second embodiment of the present invention. In addition, FIGS. 4A to 4G are cross-sectional views showing the production process of a reflective mask 201 using the mask blank 101. This reflective mask blank 101 has a configuration in which a multi-layer reflective film 5, a protective layer 6, an absorber film 2 provided with a lower layer 23 and an upper layer 24, and an etching mask film 3 are laminated on a substrate 1. In addition, the configuration has a highly oxidized layer 242 is formed on the surface layer of the upper layer 24 on the opposite side from the lower layer 23 (side toward to the etching mask film 3). The portion of the upper layer 24 excluding the highly oxidized layer 242 is an upper layer body 241. The details of each configuration of the reflective mask blank 101 are as previously described. The following provides an explanation of a method of manufacturing a reflective mask in accordance with the production process shown in FIG. 4.

Figure 4A:
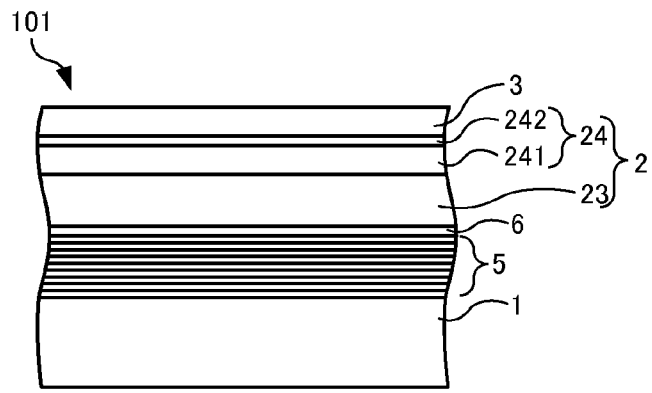
FIGS. 4A to 4G are cross-sectional views showing the manufacturing process of a reflective mask in a second embodiment of the present invention.
Figure 4B:
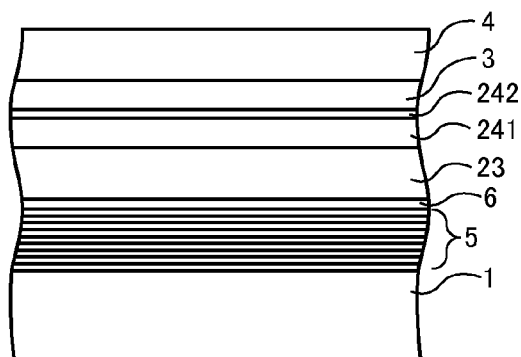
Figure 4C:
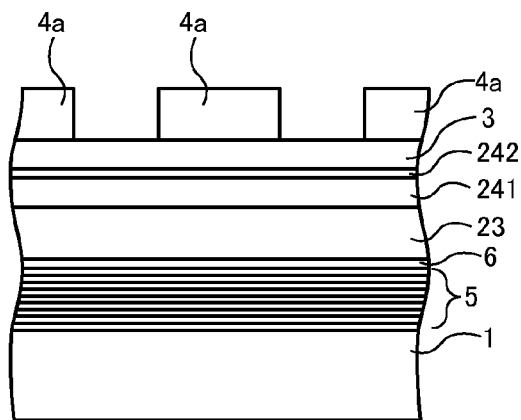
Figure 4D:
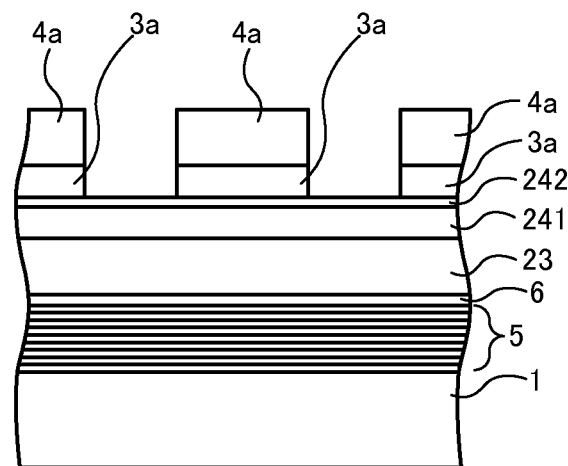
Figure 4E:
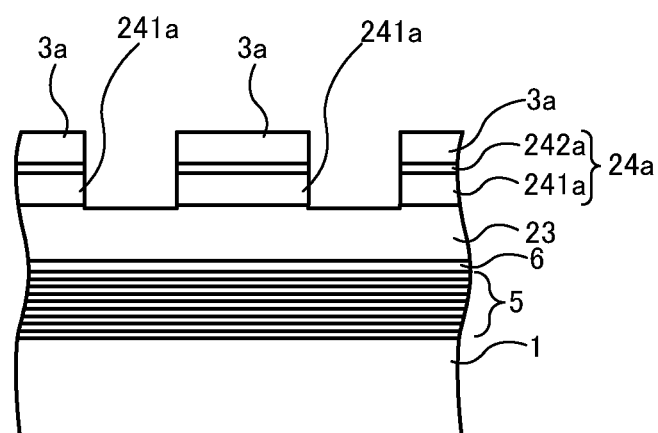

First, a resist film 4 is formed on the etching mask film 3 of the reflective mask blank 101 (see FIG. 4B). Next, a desired transfer pattern is formed by exposure drawing on the resist film 4 followed by carrying out prescribed treatment such as development treatment to form the resist film 4 having a transfer pattern (resist pattern 4a) (see FIG. 4C). Continuing, a transfer pattern is formed on the etching mask film 3 (etching mask pattern 3a) by using the resist pattern 4a as a mask and carrying out dry etching using a mixed gas of a chlorine-based gas and oxygen gas (see FIG. 4D). Next, the resist pattern 4a is removed, and dry etching is carried out using a fluorine-based gas by using the etching mask pattern 3a as a mask to form a transfer pattern (upper layer pattern 24a) on the upper layer 24 (the highly oxidized layer 242 and the upper layer body 241) (see FIG. 4E). At this time, since the lower layer 23 is formed with a material that is also dry etched with fluorine-based gas, some etching of the top of the lower layer 23 is carried out but it does not present a particular problem. Furthermore, the resist pattern 4a may be allowed to remain when dry etching is carried out on the upper layer 24. In that case, the resist pattern 4a is removed after having formed the absorber film pattern 2a.

Figure 4F:
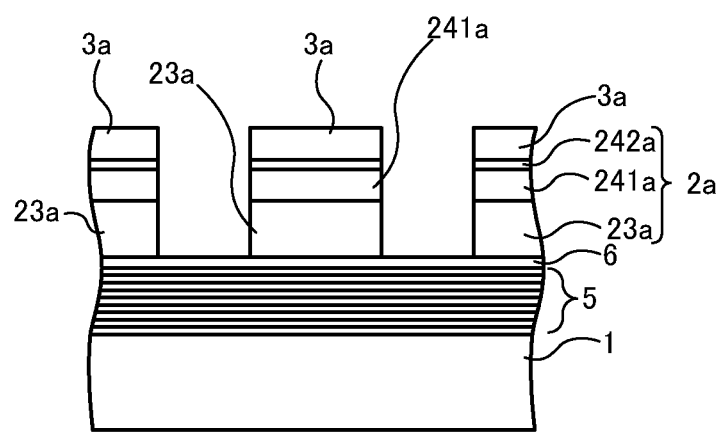
Figure 4G:
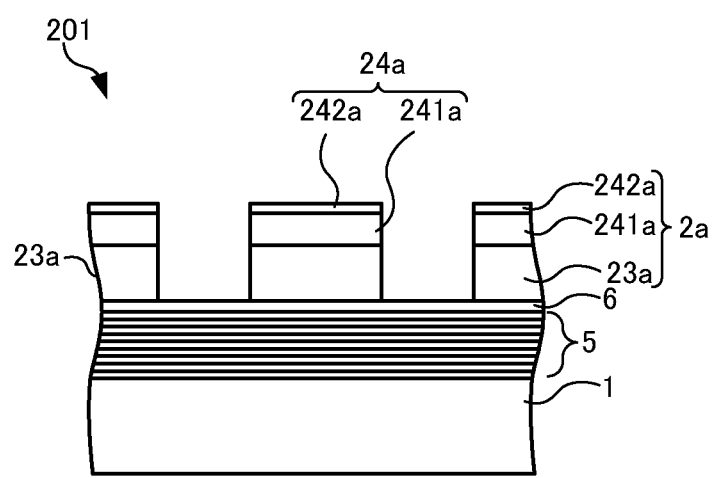

Continuing, a transfer pattern (lower layer pattern 23a) is formed on the lower layer 23 by using the etching mask pattern 3a or the upper layer pattern 24a as a mask and carrying out dry etching using an oxygen-free, chlorine-based gas (see FIG. 4F). As a result of this step, the absorber film pattern 2a is formed in which the lower layer pattern 23a and the upper layer pattern 24a (highly oxidized layer pattern 242a and upper layer body pattern 241a) are laminated. Moreover, dry etching is carried out using a mixed gas of a chlorine-based gas and oxygen gas to remove the etching mask pattern 3a followed by undergoing a desired treatment such as washing to obtain the reflective mask 201 (see FIG. 4G).

As previously described, the surface of the absorber film 2 (highly oxidized layer 242) has high resistance even if dry etching is carried out using a mixed gas of a chlorine-based gas and oxygen gas when removing the etching mask pattern 3a. Consequently, in-plane uniformity reflectance with respect to inspection light of the absorber film pattern 2a of the fabricated reflective mask 201 is high and other optical properties are favorable. In addition, line edge roughness of the absorber film pattern 2a is also favorable.

Furthermore, although different etching gases were applied to the upper layer and the lower layer in the method of manufacturing the reflective mask of the above-mentioned second embodiment, dry etching may also be carried out with the same etching gas (such as a fluorine-based gas) for the upper layer and the lower layer. Furthermore, the chlorine-based gas and fluorine-based gas used in the above-mentioned dry etching are the same as in the method of manufacturing the reflective mask of the first embodiment.

In addition, in the method of manufacturing the reflective mask of the above-mentioned second embodiment, by adjusting the configuration and thickness of the etching mask film 3, the etching mask film having a transfer pattern (etching mask pattern 3a) can be removed by dry etching using chlorine gas substantially without containing oxygen, which is carried out when a transfer pattern on the lower layer 23 (lower layer pattern 23a) is formed. In this case, it is necessary to remove the resist pattern 4a after having formed a transfer pattern in the etching mask film 3.

An experiment was conducted on etching mask films containing chromium to obtain conditions at which the dry etching rate with respect to oxygen-free, chlorine-based gas increases. More specifically, dry etching using a chlorine-based gas ($Cl_2$) without containing oxygen was carried out on eight types of sample films of the chromium-based materials shown in Table 1 followed by determination of each etching rate. The results are shown in FIG. 5.

TABLE 1

| Sample | Film Material | Content in Film (at %) | | | |
|---|---|---|---|---|---|
| | | Cr | O | N | C |
| A | CrO-based | 96.1 | 3.9 | — | — |
| B | Cr(O)N-based | 75.0 | 11.0 | 14.0 | — |
| C | CrOCN-based | 48.9 | 26.4 | 14.1 | 10.6 |
| D | CrO-based | 72.6 | 27.4 | — | — |
| E | CrOCN-based | 33.6 | 38.9 | 16.3 | 11.2 |
| F | CrO-based | 45.5 | 54.5 | — | — |
| G | CrO-based | 40.0 | 60.0 | — | — |
| H | CrO-based | 33.7 | 66.3 | — | — |

Figure 5:
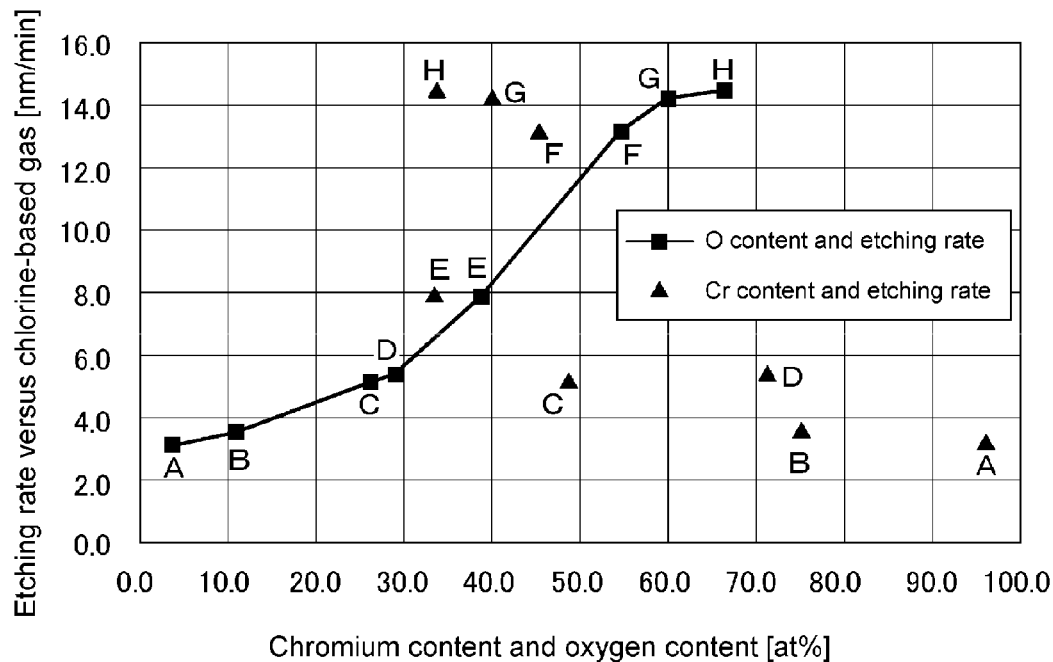
FIG. 5 is a figure showing the relationship between chromium content and oxygen content in an etching mask film and etching rate with chlorine-based gas.

In FIG. 5, the relationship between the oxygen content and the etching rate with oxygen-free, chlorine-based gas for each sample film is plotted and indicated with black squares (■) and the relationship between the chromium content of each film and the etching rate with chlorine-based gas for each sample film is plotted and indicated with black triangles (▲). Furthermore, the letters appended to each plot of black squares (■) and black triangles (▲) in FIG. 5 correspond to letters representing the sample films. According to these results, a correlation is observed between oxygen content and etching rate with oxygen-free, chlorine-based gas. In addition, it is found that the effects of containing nitrogen and carbon in the sample films are also low. On the other hand, it is found that the correlation between chromium content and etching rate with oxygen-free, chlorine-based gas is low.

In addition, according to the results shown in FIG. 5, when the oxygen content in a chromium-based material film is not less than 40 at %, the etching rate with oxygen-free, chlorine-based gas becomes not less than 8.0 nm/min. For example, there could be a case that requires 30 seconds for dry etching with an oxygen-free, chlorine-based gas in order to form a transfer pattern on the lower layer of the absorber film. In this case, when the etching mask film is formed with a chromium-based material having oxygen content of not less than 40 at %, the etching mask film can be removed simultaneous to dry etching of the lower layer up to a layer thickness of 4 nm. In addition, when the etching mask film is formed with a chromium-based material having oxygen content of not less than 45 at %, the etching mask film can be removed simultaneous to dry etching of the lower layer, if the thickness of the etching mask film is up to 5 nm. When the etching mask film is formed with a chromium-based material having oxygen content of not less than 50 at %, the etching mask film can be removed simultaneous to dry etching the lower layer, if the thickness of the etching mask film is up to 6 nm. When the etching mask film is formed with a chromium-based material having oxygen content of not less than 60 at %, the etching mask film can be removed simultaneous to dry etching the lower layer, if the thickness of the etching mask film is up to 7 nm.

Among the sample films used in the experiment, even in the case of the sample film H having the highest oxygen content, it is difficult to remove the etching mask film simultaneous to dry etching the lower layer under the above-mentioned conditions if the layer thickness exceeds 7.25 nm. The sample film H has an oxygen content that is theoretically closest to the oxygen content of the most oxidized chromium oxide. On the basis of the aforementioned findings, it is desirable that the etching mask film in the reflective mask blank of the second embodiment is not more than 7 nm, preferably not more than 6 nm and more preferably not more than 5 nm. In addition, the etching mask film composed of a chromium-based material in the reflective mask blank of the second embodiment is preferably at least not less than 4 nm in order to be a minimum prescribed perpendicularity of pattern sidewalls when a transfer pattern is formed. On the basis thereof, it is desirable that the oxygen content of the etching mask film be not less than 40 at %. In addition, the oxygen content of the etching mask film is preferably not less than 45 at %, more preferably not less than 50 at % and even more preferably not less than 60 at %.

The absorber film of the reflective mask blank in each of the aforementioned embodiments is not limited to the aforementioned laminated structure. The absorber film may have a three layer structure, may be in the form of a single layer, composition gradient film, or may have a film structure with a composition gradient between the upper layer and the lower layer. A reflective mask fabricated from the reflective mask blank in each of the aforementioned embodiments has favorable line edge roughness and superior pattern precision. Consequently, it is particularly preferable in the case of fabricating a reflective mask set adopting double patterning technology (DP technology or DE technology and the like) that requires extremely high positional accuracy for the absorber film pattern.

A highly oxidized layer containing oxygen at not less than 60 at % is also preferably formed on the surface layer of an absorber film pattern formed with an absorber film of a reflective mask fabricated from the reflective mask blank of each of the embodiments. The form, functions and effects of the highly oxidized layer and a highly oxidized layer of a material containing tantalum and the like are the same as previously described.

EXAMPLES

The following provides an explanation of examples of producing reflective mask blanks and reflective masks according to the present embodiments as examples of the present invention with reference to FIGS. 1 to 4

Example 1

Production of Reflective Mask Blank

A substrate was prepared that was composed of $SiO_2$—$TiO_2$ glass having vertical and horizontal dimensions of about 152 mm×152 mm and having a thickness of about 6.25 mm. The edge faces and main surface of this substrate 1 were polished to a prescribed surface roughness (root mean square roughness Rq: not more than 0.15 nm), followed by carrying out prescribed washing treatment and drying treatment.

Next, the transparent substrate 1 was installed in an ion beam sputtering apparatus and the multilayer reflective film 5 was deposited by ion beam sputtering using a Si target and Mo target. More specifically, a 4.2 nm Si film was deposited after laminating 40 periods consisting of a 4.2 nm Si film and 2.8 nm Mo film. Continuing, the substrate 1 on which the multilayer reflective film 5 was formed was installed in a single-wafer DC sputtering apparatus, and the protective layer 6 composed of RuNb was formed to a thickness of 2.5 nm on the multilayer reflective film 5 by DC sputtering using a mixed target of Ru and Nb (Ru:Nb=80 at %:20 at %).

Next, after having deposited the protective layer 6, the substrate 1 was installed in a different single-wafer DC sputtering apparatus, and the lower layer 23 of the absorber film composed of TaN was deposited at a layer thickness of 56 nm by reactive sputtering using a tantalum target while introducing a mixed gas of Xe and $N_2$. Continuing, with the substrate 1 still installed in the sputtering apparatus, the gas inside the sputtering apparatus was replaced with a mixed gas of Ar and $O_2$, and the upper layer 24 of the absorber film composed of TaO was deposited at a layer thickness of 14 nm by reactive sputtering.

Hot water treatment (surface treatment) was carried out on the transparent substrate 1 on which the absorber film 2 composed of a tantalum-based material was formed by immersing for 120 minutes in deionized (DI) water at 90° C. prior to the progression of natural oxidation (such as within 1 hour after deposition) or after storing in an environment in which natural oxidation does not progress following deposition. Auger electron spectroscopy (AES) was carried out on the absorber film 2 after the hot water treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. In addition, the compositions of the other layers are: lower layer (Ta: 86 at %, N: 16 at %), and upper layer body 241 excluding the highly oxidized layer 242 (Ta: 42 at %, O: 58 at %). Furthermore, reflectance on the surface side (surface reflectance) of this absorber film 2 was 25.1% with respect to inspection light having a wavelength of 193 nm.

Figure 6:
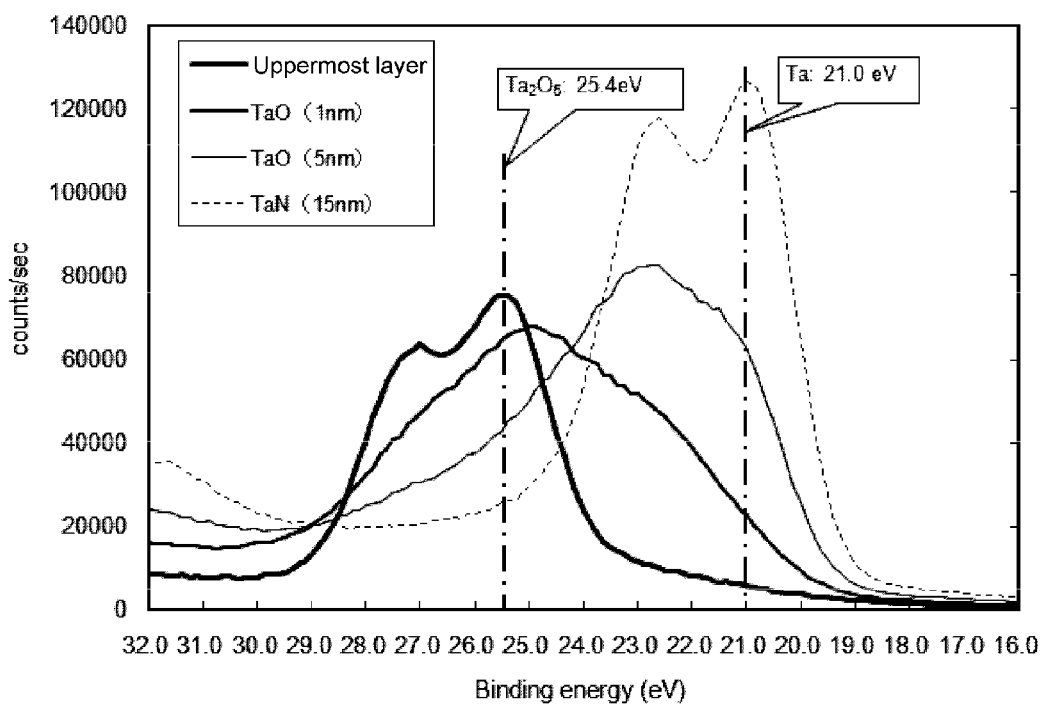
FIG. 6 is a figure showing the results of analyzing an absorber film of a mask blank in the examples by X-ray photoelectron spectroscopy (XPS) (Ta 4f narrow spectrum).

In addition, the absorber film 2 was analyzed by X-ray photoelectron spectroscopy (XPS). The Ta 4f narrow spectrum of the absorber film 2 is shown in FIG. 6. According to the results of FIG. 6, A high peak was observed at the location of the binding energy of $Ta_2O_5$ (25.4 eV) in the narrow spectrum of the uppermost layer of the absorber film 2. In addition, a peak of the Ta 4f narrow spectrum in a layer at a depth of 1 nm from the surface of the absorber film 2 was between the binding energy of $Ta_2O_5$ (25.4 eV) and the binding energy of Ta (21.0 eV), and the peak was observed closer to $Ta_2O_5$. From these results, it is possible to say that the highly oxidized layer 242 having $Ta_2O_5$ bonding was formed in the surface layer of the upper layer 24.

Next, the substrate on which the absorber film 2 had been formed was installed in a single-wafer DC sputtering apparatus, and the etching mask film 3 (hard mask film) composed of CrOCN (Cr: 34 at %, O: 39 at %, C: 11 at %, N: 16 at %) was deposited at a layer thickness of 10 nm by reactive sputtering using a chromium target while introducing a mixed gas of Ar, $CO_2$ and $N_2$. In this manner, the reflective mask blank 101 of Example 1 with laminating the absorber film 2, having a laminated structure consisting of the multilayer reflective film 5 composed of a periodic laminated film of Si films and Mo films, the protective layer 6 composed of RuNb, the lower layer 23 composed of TaN and the upper layer 24 composed of TaO and containing the tantalum highly oxidized layer 242 in the surface layer thereof, on the main surface of the substrate, and the etching mask film 3 composed of CrOCN further laminated thereon in this order, was obtained.

[Production of Reflective Mask]

Next, the reflective mask 201 of Example 1 was fabricated according to the following procedure using the reflective mask blank 101 of Example 1. First, the resist film 4 composed of a chemically amplified resist for electron beam lithography was formed at a layer thickness of 60 nm on the etching mask film 3 by spin coating (see FIG. 4B). Next, a transfer pattern was formed on the resist film 4 by electron beam drawing followed by carrying out prescribed development treatment and washing treatment to form the resist pattern 4a (see FIG. 4C). Furthermore, the transfer pattern formed by electron beam lithography had a 22 nm mode fine pattern. Next, a transfer pattern (etching mask pattern 3a) was formed on the etching mask film 3 by using the resist pattern 4a as a mask and carrying out dry etching using a mixed gas of a chlorine-based gas ($Cl_2$) and oxygen gas (see FIG. 4D). Continuing, after removing the resist pattern 4a, a transfer pattern (upper layer pattern 24a) was formed on the upper layer 24 comprising the highly oxidized layer 242 of the absorber film 2 by using the etching mask pattern 3a as a mask and carrying out dry etching using a fluorine-based gas ($CF_4$) (see FIG. 4E). At this time, the top side of the lower layer 23 was also etched to a certain degree. Moreover, a transfer pattern (lower layer pattern 23a) was formed on the lower layer 23 by using the etching mask pattern 3a or the upper layer pattern 24a as a mask and carrying out dry etching using a chlorine-based gas ($Cl_2$) (see FIG. 4F). Finally, the etching mask pattern 3a was removed by carrying out dry etching using a mixed gas of a chlorine-based gas ($Cl_2$) and oxygen gas (see FIG. 4G). The reflective mask 201 was obtained as a result of carrying out the aforementioned procedure.

The reflectance on the surface side of the absorber film pattern 2a of the reflective mask 201 fabricated in Example 1 was 25.2% with respect to inspection having a wavelength of 193 nm, and there was almost no change in comparison with the reflectance of the mask blank measured at the stage of deposition of the absorber film 2. In addition, the line edge roughness of the absorber film pattern 2a was measured and it was sufficiently small. Moreover, TEM observation of a cross-section of the sidewalls of the absorber film pattern 2a was carried out and rounding of the edges of the upper layer pattern 24a was within an allowable range, thereby demonstrating favorable results. This reflective mask having a 22 nm node fine absorber film pattern 2a can be said to have precision sufficient for normal pattern transfer, even if the reflective mask is used for exposure lithography on a resist film on a semiconductor device with an exposure apparatus having EUV light for the light source.

Example 2

Production of Reflective Mask Blank

The reflective mask blank of Example 2 was fabricated according to the same procedure as Example 1 with the exception of changing the material of the etching mask film 3 to CrO (Cr: 46 at %, O: 54 at %) and changing the layer thickness to 6 nm.

[Production of Reflective Mask]

Next, the reflective mask 201 of Example 2 was fabricated according to the following procedure using the reflective mask blank 101 of Example 2. First, the resist film 4 composed of a chemically amplified resist for electron beam lithography was formed at a layer thickness of 60 nm on the etching mask film 3 by spin coating (see FIG. 4B). Next, the resist pattern 4a was formed in the resist film 4 by electron beam drawing followed by carrying out prescribed development treatment and washing treatment (see FIG. 4C). Furthermore, the transfer pattern formed by electron beam lithography had a 22 nm node fine pattern. Next, a transfer pattern (etching mask pattern 3a) was formed on the etching mask film 3 by using the resist pattern 4a as a mask and carrying out dry etching using a mixed gas of a chlorine-based gas ($Cl_2$) and oxygen gas (see FIG. 4D). Continuing, after removing the resist pattern 4a, a transfer pattern (upper layer pattern 24a) was formed on the upper layer 24 comprising the highly oxidized layer 242 of the absorber film 2 by using the etching mask pattern 3a as a mask and carrying out dry etching using a fluorine-based gas ($CF_4$) (see FIG. 4E). At this time, the top side of the lower layer 23 was also etched to a certain degree. Moreover, a transfer pattern (lower layer pattern 23a) was formed on the lower layer 23 by using the upper layer pattern 24a as a mask and carrying out dry etching using a chlorine-based gas ($Cl_2$). At this time, the etching mask pattern 3a was also completely removed by dry etching using a chlorine-based gas ($Cl_2$) (see FIG. 4G). The reflective mask 201 was obtained as a result of carrying out the aforementioned procedure.

The reflectance on the surface side of the absorber film pattern 2a of the reflective mask 201 fabricated in Example 2 was 25.6% with respect to inspection having a wavelength of 193 nm, and there was almost no change in comparison with the reflectance of the mask blank measured at the stage of deposition of the absorber film 2. In addition, the line edge roughness of the absorber film pattern 2a was measured and it was sufficiently small. Moreover, TEM observation of a cross-section of the sidewalls of the absorber film pattern 2a was carried out and rounding of the edges of the upper layer pattern 24a was within an allowable range, thereby demonstrating favorable results. This reflective mask having a 22 nm node fine absorber film pattern 2a can be said to have precision sufficient for normal pattern transfer, even if the reflective mask is used for exposure lithography on a resist film on a semiconductor device with an exposure apparatus having EUV light for the light source.

Example 3

Production of Reflective Mask Blank

The reflective mask blank of Example 3 was fabricated according to the same procedure as Example 1 with the exception of carrying out the process for forming the highly oxidized layer 242 on the upper layer 24 of the absorber film 2 by ozone water treatment instead of hot water treatment. Ozone water treatment (surface treatment) was carried out by applying ozone-containing water having an ozone concentration of 50 ppm and temperature of 25° C. under the condition of a treatment time of 15 minutes.

The absorber film 2 was measured by Auger electron spectroscopy (AES) after the ozone water treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the absorber film 2 were the same as those of the absorber film 2 of Example 1. In addition, when the absorber film 2 was analyzed by X-ray photoelectron spectroscopy (XPS), a high peak was observed at the location of the binding energy of $Ta_2O_5$ (25.4 eV) in the Ta 4f narrow spectrum of the uppermost layer of the absorber film 2. In addition, a peak of the Ta 4f narrow spectrum in a layer at a depth of 1 nm from the surface of the absorber film 2 was between the binding energy of $Ta_2O_5$ (25.4 eV) and the binding energy of Ta (21.0 eV), and the peak was observed closer to $Ta_2O_5$. From these results, it is possible to say that the highly oxidized layer 242 having $Ta_2O_5$ bonding was formed in the surface layer of the upper layer 24.

[Production of Reflective Mask]

Next, the reflective mask of Example 3 was fabricated according to the same procedure as Example 1 using the reflective mask blank of Example 3. The reflectance on the surface side of the absorber film pattern 2a of the reflective mask 201 fabricated in Example 3 was 25.3% with respect to inspection light having a wavelength of 193 nm, and there was almost no change in comparison with the reflectance of the mask blank measured at the stage of deposition of the absorber film 2. In addition, the line edge roughness of the absorber film pattern 2a was measured and it was sufficiently small. Moreover, TEM observation of a cross-section of the sidewalls of the absorber film pattern 2a was carried out and rounding of the edges of the upper layer pattern 24a was within an allowable range, thereby demonstrating favorable results. This reflective mask having a 22 nm node fine absorber film pattern 2a can be said to have precision sufficient for normal pattern transfer, even if the reflective mask is used for exposure lithography on a resist film on a semiconductor device with an exposure apparatus having EUV light for the light source.

Example 4

Production of Reflective Mask Blank

The reflective mask blank of Example 4 was fabricated according to the same procedure as Example 1 with the exception of carrying out the process for forming the highly oxidized layer 242 on the upper layer 24 of the absorber film 2 by heat treatment instead of hot water treatment. Heat treatment (surface treatment) was carried out in air under conditions of a heating temperature of 140° C. and treatment time of 30 minutes.

The absorber film 2 was measured by Auger electron spectroscopy (AES) after the heat treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the absorber film 2 were the same as those of the absorber film 2 of Example 1. In addition, when the absorber film 2 was analyzed by X-ray photoelectron spectroscopy (XPS), a high peak was observed at the location of the binding energy of $Ta_2O_5$ (25.4 eV) in the Ta 4f narrow spectrum of the uppermost layer of the absorber film 2. In addition, a peak of the Ta 4f narrow spectrum in a layer at a depth of 1 nm from the surface of the absorber film 2 was between the binding energy of $Ta_2O_5$ (25.4 eV) and the binding energy of Ta (21.0 eV), and the peak was observed closer to $Ta_2O_5$. From these results, it is possible to say that the highly oxidized layer 242 having $Ta_2O_5$ bonding was formed in the surface layer of the upper layer 24.

[Production of Reflective Mask]

Next, the reflective mask of Example 4 was fabricated according to the same procedure as Example 1 using the reflective mask blank of Example 4. The reflectance on the surface side of the absorber film pattern 2a of the reflective mask 201 fabricated in Example 4 was 25.3% with respect to inspection light having a wavelength of 193 nm, and there was almost no change in comparison with the reflectance of the mask blank measured at the stage of deposition of the absorber film 2. In addition, the line edge roughness of the absorber film pattern 2a was measured and it was sufficiently small. Moreover, TEM observation of a cross-section of the sidewalls of the absorber film pattern 2a was carried out and rounding of the edges of the upper layer pattern 24a was within an allowable range, thereby demonstrating favorable results. This reflective mask having a 22 nm node fine absorber film pattern 2a can be said to have precision sufficient for normal pattern transfer, even if the reflective mask is used for exposure lithography on a resist film on a semiconductor device with an exposure apparatus having EUV light for the light source.

Example 5

Production of Reflective Mask Blank

The reflective mask blank of Example 5 was fabricated according to the same procedure as Example 1 with the exception of carrying out the process for forming the highly oxidized layer 242 on the upper layer 24 of the absorber film 2 by ultraviolet irradiation treatment instead of hot water treatment. Ultraviolet irradiation treatment (surface treatment) was carried out by scanning the entire surface with ArF excimer laser light of 50 mJ/cm$^2$ at a scanning rate of 1 cm/second.

The absorber film 2 was measured by Auger electron spectroscopy (AES) after the ultraviolet irradiation treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the absorber film 2 were the same as those of the absorber film 2 of Example 1. In addition, when the absorber film 2 was analyzed by X-ray photoelectron spectroscopy (XPS), a high peak was observed at the location of the binding energy of $Ta_2O_5$ (25.4 eV) in the Ta 4f narrow spectrum of the uppermost layer of the absorber film 2. In addition, a peak of the Ta 4f narrow spectrum in a layer at a depth of 1 nm from the surface of the light absorber film 2 was between the binding energy of $Ta_2O_5$ (25.4 eV) and the binding energy of Ta (21.0 eV), and the peak was observed closer to $Ta_2O_5$. From these results, it is possible to say that a highly oxidized layer 242 having $Ta_2O_5$ bonding was formed in the surface layer of the upper layer 24.

[Production of Reflective Mask]

Next, the reflective mask of Example 5 was fabricated according to the same procedure as Example 1 using the reflective mask blank of Example 5. The reflectance on the surface side of the absorber film pattern 2a of the reflective mask 201 fabricated in Example 5 was 25.2% with respect to inspection light having a wavelength of 193 nm, and there was almost no change in comparison with the reflectance of the mask blank measured at the stage of deposition of the absorber film 2. In addition, the line edge roughness of the absorber film pattern 2a was measured and it was sufficiently small. Moreover, TEM observation of a cross-section of the sidewalls of the absorber film pattern 2a was carried out and rounding of the edges of the upper layer pattern 24a was within an allowable range, thereby demonstrating favorable results. This reflective mask having a 22 nm node fine absorber film pattern 2a can be said to have precision sufficient for normal pattern transfer, even if the reflective mask is used for exposure lithography on a resist film on a semiconductor device with an exposure apparatus having EUV light for the light source.

Example 6

Production of Reflective Mask Blank

The reflective mask blank of Example 6 was fabricated according to the same procedure as Example 1 with the exception of carrying out the process for forming the highly oxidized layer 242 on the upper layer 24 of the absorber film 2 by oxygen plasma treatment instead of hot water treatment. Oxygen plasma treatment (surface treatment) was carried out by introducing the reflective mask blank 101 into a resist stripping apparatus for carrying out oxygen plasma ashing under conditions of a treatment time of 5 minutes.

The absorber film 2 was measured by Auger electron spectroscopy (AES) after the oxygen plasma treatment. From the results, it was confirmed that the highly oxidized layer 242 was formed at a thickness of 2 nm on the surface layer of the upper layer 24. The oxygen content of this highly oxidized layer 242 was 71.4 at % to 67 at %. The compositions and optical properties of each of the other layers of the absorber film 2 were the same as those of the absorber film 2 of Example 1. In addition, when the absorber film 2 was analyzed by X-ray photoelectron spectroscopy (XPS), a high peak was observed at the location of the binding energy of $Ta_2O_5$ (25.4 eV) in the Ta 4f narrow spectrum of the uppermost layer of the absorber film 2. In addition, a peak of the Ta 4f narrow spectrum in a layer at a depth of 1 nm from the surface of the absorber film 2 was between the binding energy of $Ta_2O_5$ (25.4 eV) and the binding energy of Ta (21.0 eV), and the peak was observed closer to $Ta_2O_5$. From these results, it is possible to say that the highly oxidized layer 242 having $Ta_2O_5$ bonding was formed in the surface layer of the upper layer 24.

[Production of Reflective Mask]

Next, the reflective mask of Example 6 was fabricated according to the same procedure as Example 1 using the reflective mask blank of Example 6. The reflectance on the surface side of the absorber film pattern 2a of the reflective mask 201 fabricated in Example 6 was 25.3% with respect to inspection light having a wavelength of 193 nm, and there was almost no change in comparison with the reflectance of the mask blank measured at the stage of deposition of the absorber film 2. In addition, the line edge roughness of the absorber film pattern 2a was measured and it was sufficiently small. Moreover, TEM observation of a cross-section of the sidewalls of the absorber film pattern 2a was carried out and rounding of the edges of the upper layer pattern 24a was within an allowable range, thereby demonstrating favorable results. This reflective mask having a 22 nm node fine absorber film pattern 2a can be said to have precision sufficient for normal pattern transfer, even if the reflective mask is used for exposure lithography on a resist film on a semiconductor device with an exposure apparatus having EUV light for the light source.

Example 7

Production of Reflective Mask Blank

The reflective mask blank of Example 7 was fabricated according to the same procedure as Example 1 with the exception of depositing the absorber film 2 with a single layer of TaN (layer thickness: 60 nm) as shown in FIG. 1. In addition, after depositing the absorber film 2 composed of TaN, hot water treatment was carried out under the same conditions as Example 1 and the highly oxidized layer 22 was formed on the surface layer of the absorber film 2.

The absorber film 2 was measured by Auger electron spectroscopy (AES) after the hot water treatment. From the results, it was confirmed that the highly oxidized layer 22 was formed at a thickness of 2 nm on the surface layer of the absorber film 2. The oxygen content of this highly oxidized layer 22 was 71.4 at % to 67 at %. In addition, the layer composition of the absorber body 21 excluding the highly oxidized layer 22 consisted of Ta: 77 at % and N: 23 at %. In addition, when the absorber film 2 was analyzed by X-ray photoelectron spectroscopy (XPS), a high peak was observed at the location of the binding energy of $Ta_2O_5$ (25.4 eV) in the Ta 4f narrow spectrum of the uppermost layer of the absorber film 2. In addition, a peak of the Ta 4f narrow spectrum in a layer at a depth of 1 nm from the surface of the absorber film 2 was between the binding energy of $Ta_2O_5$ (25.4 eV) and the binding energy of Ta (21.0 eV), and the peak was observed closer to $Ta_2O_5$. From these results, it is possible to say that the highly oxidized layer 22 having $Ta_2O_5$ bonding was formed in the surface layer of the absorber film 2.

[Production of Reflective Mask]

Next, the reflective mask 200 of Example 7 was fabricated according to the following procedure using the reflective mask blank 100 of Example 7. First, the resist film 4 composed of a chemically amplified resist for electron beam lithography was formed at a layer thickness of 60 nm on the etching mask film 3 by spin coating (see FIG. 2B). Next, a transfer pattern was formed on the resist film 4 by electron beam drawing followed by carrying out prescribed development treatment and washing treatment to form the resist pattern 4a (see FIG. 2C). Furthermore, the transfer pattern formed by electron beam lithography had a 22 nm node fine pattern. Next, a transfer pattern (etching mask pattern 3a) was formed on the etching mask film 3 by using the resist pattern 4a as a mask and carrying out dry etching using a mixed gas of a chlorine-based gas ($Cl_2$) and oxygen gas (see FIG. 2D). Continuing, after removing the resist pattern 4a, a transfer pattern (absorber film pattern 2a) was formed on the absorber film 2 comprising the highly oxidized layer 22 by using the etching mask pattern 3a as a mask and carrying out dry etching using a chlorine-based gas ($Cl_2$) (see FIG. 2E). Finally, the etching mask pattern 3a was removed by carrying out dry etching using a mixed gas of a chlorine-based gas ($Cl_2$) and oxygen gas (see FIG. 2F). The reflective mask 200 was obtained as a result of carrying out the aforementioned procedure.

The reflectance on the surface side of the absorber film pattern 2a of the reflective mask 200 fabricated in Example 7 with respect to inspection light having a wavelength of 193 nm was almost no change in comparison with the reflectance of the mask blank measured at the stage of deposition of the absorber film 2. In addition, the line edge roughness of the absorber film pattern 2a was measured and it was sufficiently small. Moreover, TEM observation of a cross-section of the sidewalls of the absorber film pattern 2a was carried out and rounding of the edges of the absorber film pattern 2a was within an allowable range, thereby demonstrating favorable results. This reflective mask having a 22 nm node fine absorber film pattern 2a can be said to have precision sufficient for normal pattern transfer, even if the reflective mask is used for exposure lithography on a resist film on a semiconductor device with an exposure apparatus having EUV light for the light source.

Comparative Example 1

Production of Reflective Mask Blank

The reflective mask blank of Comparative Example 1 was fabricated according to the same procedure as Example 1 with the exception of immediately forming the etching mask film 3 after forming the upper layer 24 on the absorber film 2 (and the process for forming the highly oxidized layer 242 was not carried out).

[Production of Reflective Mask]

Next, the reflective mask of Comparative Example 1 was fabricated according to the same procedure as Example 1 using the reflective mask blank of Comparative Example 1. The reflectance on the surface side of the absorber film pattern 2a of the reflective mask 201 fabricated in Comparative Example 1 was 28.5% with respect to inspection light having a wavelength of 193 nm, and the change in reflectance was large in comparison with the reflectance of the mask blank measured at the stage of deposition of the absorber film 2 in Example 1 under the same conditions. The distribution of in-plane reflectance of the absorber film 2 was also confirmed to have worsened. In addition, the line edge roughness was measured and it was exceeded the allowed range in the 22 nm node. TEM observation of a cross-section of the sidewalls of the absorber film pattern 2a was carried out and rounding of the edges of the upper layer pattern 24a exceeded the allowed range. This reflective mask having a 22 nm node fine absorber film pattern 2a was considered to be unlikely to have precision sufficient for normal pattern transfer, if the reflective mask is used for exposure lithography on a resist film on a semiconductor device with an exposure apparatus having EUV light for the light source.

The invention claimed is:

1. A reflective mask blank used to fabricate a reflective mask comprising:
   a substrate;
   a multilayer reflective film formed above the substrate; and
   an absorber film formed above the multilayer reflective film, wherein
   the absorber film comprises a material containing tantalum,
   a highly oxidized layer is formed on the surface layer of the absorber film on the opposite side from the substrate, and
   an oxygen content of the highly oxidized layer is not less than 67 at %.

2. The reflective mask blank according to claim 1, wherein ratio of presence of $Ta_2O_5$ bonding in the highly oxidized layer is higher than the ratio of the presence of $Ta_2O_5$ bonding in the absorber film.

3. The reflective mask blank according to claim 1, wherein the absorber film comprises a material that further contains nitrogen.

4. The reflective mask blank according to claim 1, wherein the absorber film has a laminated structure of a lower layer and an upper layer in this order starting from the side of the substrate, and the highly oxidized layer is formed on the surface layer of the upper layer on the opposite side from the lower layer.

5. The reflective mask blank according to claim 4, wherein the oxygen content of the upper layer is less than the oxygen content of the highly oxidized layer.

6. The reflective mask blank according to claim 5, wherein the oxygen content in the portion of the upper layer other than the highly oxidized layer is not less than 50 at %.

7. The reflective mask blank according to claim 4, wherein the ratio of the presence of $Ta_2O_5$ bonding in the highly oxidized layer is higher than the ratio of the presence of $Ta_2O_5$ bonding in the upper layer.

8. The reflective mask blank according to claim 4, wherein the oxygen content of the lower layer is less than 10 at %.

9. The reflective mask blank according to claim 4, wherein the lower layer comprises a material that contains nitrogen.

10. The reflective mask blank according to claim 1, further comprising an etching mask film above the on absorber film, wherein the etching mask film comprises a material containing chromium.

11. The reflective mask blank according to claim 1, further comprising a protective layer between the multilayer reflective film and the absorber film, wherein the protective layer includes Ru.

12. A method of manufacturing reflective mask, the method comprising forming an absorber film pattern above the multilayer reflective film by etching the absorber film in the reflective mask blank according to claim 1.

13. A reflective mask comprising:
a substrate;
a multilayer reflective film formed above the substrate; and
an absorber film pattern formed above the multilayer reflective film, wherein
the absorber film pattern comprises a material containing tantalum,
a highly oxidized layer is formed on the surface layer of the absorber film pattern on the opposite side from the substrate, and
an oxygen content of the highly oxidized layer is not less than 67 at %.

14. The reflective mask according to claim 13, wherein ratio of presence of $Ta_2O_5$ bonding in the highly oxidized layer is higher than the ratio of the presence of $Ta_2O_5$ bonding in the absorber film pattern.

15. The reflective mask according to claim 13, wherein the absorber film pattern comprises a material that further contains nitrogen.

16. The reflective mask according to claim 13, wherein the absorber film pattern has a laminated structure of a lower layer and an upper layer in this order starting from the side of the substrate, and the highly oxidized layer is formed on the surface layer of the upper layer on the opposite side from the lower layer.

17. The reflective mask according to claim 16, wherein the oxygen content of the upper layer is less than the oxygen content of the highly oxidized layer.

18. The reflective mask according to claim 17, wherein the oxygen content in the portion of the upper layer other than the highly oxidized layer is not less than 50 at %.

19. The reflective mask according to claim 16, wherein the ratio of the presence of $Ta_2O_5$ bonding in the highly oxidized layer is higher than the ratio of the presence of $Ta_2O_5$ bonding in the upper layer.

20. The reflective mask according to claim 16, wherein the oxygen content of the lower layer is less than 10 at %.

21. The reflective mask according to claim 16, wherein the lower layer comprises a material that contains nitrogen.

22. The reflective mask according to claim 13, further comprising a protective layer between the multilayer reflective film and the absorber film pattern, wherein the protective layer includes Ru.

* * * * *